United States Patent
Chung et al.

(10) Patent No.: US 7,930,492 B2
(45) Date of Patent: Apr. 19, 2011

(54) MEMORY SYSTEM HAVING LOW POWER CONSUMPTION

(75) Inventors: Hoe-Ju Chung, Yongin-si (KR); Jung-Bae Lee, Yongin-si (KR); Joo-Sun Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 573 days.

(21) Appl. No.: 12/006,766

(22) Filed: Jan. 4, 2008

(65) Prior Publication Data
US 2008/0177949 A1   Jul. 24, 2008

Related U.S. Application Data

(63) Continuation of application No. 11/451,802, filed on Jun. 13, 2006.

(60) Provisional application No. 60/716,587, filed on Sep. 13, 2005.

(30) Foreign Application Priority Data

Sep. 12, 2005 (KR) .......... 10-2005-0084813
Sep. 20, 2005 (KR) .......... 10-2005-0087212
Jan. 5, 2007 (KR) .......... 10-2007-0001532

(51) Int. Cl.
*G06F 12/00* (2006.01)
*G06F 13/00* (2006.01)
*G06F 13/28* (2006.01)

(52) U.S. Cl. ............... 711/154; 711/5; 711/105; 365/51
(58) Field of Classification Search .............. 711/5, 154, 711/105; 365/51
See application file for complete search history.

(56) References Cited

U.S. PATENT DOCUMENTS

| 5,715,274 | A | 2/1998 | Rostoker et al. |
| 6,243,776 | B1 * | 6/2001 | Lattimore et al. ............ 710/104 |
| 6,493,250 | B2 | 12/2002 | Halbert et al. |
| 6,587,912 | B2 | 7/2003 | Leddige et al. |
| 6,639,820 | B1 * | 10/2003 | Khandekar et al. ............ 365/63 |
| 6,880,056 | B2 | 4/2005 | Kootstra |
| 6,938,129 | B2 | 8/2005 | David |
| 6,950,342 | B2 * | 9/2005 | Lindhorst et al. ........ 365/185.21 |
| 6,982,892 | B2 | 1/2006 | Lee et al. |

(Continued)

FOREIGN PATENT DOCUMENTS

JP   2002-007308   1/2002

(Continued)

OTHER PUBLICATIONS

Chinese Office Action dated Dec. 25, 2009 issued in corresponding Chinese Application No. 200610153630.8.

*Primary Examiner* — Stephen C Elmore
*Assistant Examiner* — Mark A Giardino, Jr.
(74) *Attorney, Agent, or Firm* — Mills & Onello LLP

(57) ABSTRACT

A memory system selectively sets signaling modes based on stack position information. The memory system includes a memory module having at least one semiconductor memory device and a memory controller configured to set a signaling mode based on stack position information of each of the semiconductor memory devices. A signaling between the memory controller and each of the semiconductor memory devices is performed in a differential signaling mode, and a signaling among the semiconductor memory devices is performed in a single-ended signaling mode. Accordingly, the memory system has reduced power consumption.

24 Claims, 12 Drawing Sheets

U.S. PATENT DOCUMENTS

| | | |
|---|---|---|
| 7,091,741 B2 | 8/2006 | Kim |
| 7,308,524 B2 | 12/2007 | Grundy et al. |
| 2002/0023191 A1 | 2/2002 | Fudeyasu |
| 2002/0180480 A1* | 12/2002 | Dreps et al. .................... 326/62 |
| 2003/0126356 A1 | 7/2003 | Gustavson et al. |
| 2004/0148482 A1 | 7/2004 | Grundy et al. |
| 2004/0230718 A1 | 11/2004 | Polzin et al. |
| 2005/0068067 A1 | 3/2005 | Kim |
| 2006/0044860 A1* | 3/2006 | Kinsley et al. ................. 365/52 |
| 2006/0047899 A1 | 3/2006 | Ilda et al. |
| 2006/0101167 A1* | 5/2006 | To et al. ......................... 710/32 |

FOREIGN PATENT DOCUMENTS

| | | |
|---|---|---|
| KR | 10-2003-0039179 A | 5/2003 |
| KR | 10-2005-0030293 A | 3/2005 |
| KR | 10-2005-0062750 A | 6/2005 |

* cited by examiner

US 7,930,492 B2

MEMORY SYSTEM HAVING LOW POWER CONSUMPTION

CROSS-REFERENCE TO RELATED APPLICATIONS

This application is a continuation-in-part of U.S. patent application Ser. No. 11/451,802, filed on Jun. 13, 2006, now pending, which is related to U.S. Provisional Patent Application Ser. No. 60/716,587, filed on Sep. 13, 2005, and which claims the benefit of priority under 35 USC §119 to Korean Patent Application No. 10-2005-0084813, filed on Sep. 12, 2005 in the Korean Intellectual Property Office (KIPO), and Korean Patent Application No. 10-2005-0087212, filed on Sep. 20, 2005 in the KIPO, the entire contents of all of the above applications being incorporated herein in their entirety by reference. This application also claims priority under 35 USC §119 to Korean Patent Application No. 10-2007-0001532, filed on Jan. 5, 2007 in the KIPO, the entire contents of which are incorporated herein in their entirety by reference.

BACKGROUND OF THE INVENTION

1. Field of the Invention

The present invention relates to a memory system, and more particularly to a memory system capable of selectively operating in a differential signaling mode or a single-ended signaling mode, and a signaling method in a memory system.

2. Description of the Related Art

The operating speed of a central processing unit (CPU) is relatively higher, for example, over one gigahertz (GHz), whereas the speed of a memory device is relatively lower, for example, about hundreds of megahertz (MHz). Therefore, a chipset such as a memory controller is used for interfacing between a computer system and the memory device. Data transmission between the computer system and the memory controller is performed at a relatively higher speed, but data transmission between the memory controller and the memory device is performed at a relatively lower speed, that is, the speed of the memory device.

As the speed of a semiconductor memory device is increased, signaling in a multi-slot mode between a memory controller and a memory module in which memory devices are mounted may be limited. Further, single-ended signaling may have a limit due to parasitic inductance that is caused between a motherboard and the memory module.

Signaling in a point-to-point mode instead of the multi-slot mode may be adopted in order to solve the above problems of signaling in the multi-slot mode. Additionally, a bus structure may include a repeater in order to achieve a large-capacity memory module in signaling that uses a point-to-point mode. Further, signaling may be performed in a differential signaling mode through a majority of buses in order to enhance the speed of signaling.

FIG. 1 is a block diagram illustrating a conventional memory system. Referring to FIG. 1, the memory system includes a memory module 10 and a memory controller 20. The memory module 10 includes semiconductor memory devices 11, 12, 13 and 14. Signaling between the memory controller 20 and each of the semiconductor memory devices 11, 12, 13 and 14 is performed through buses 1, 2, 3, 4, 5, 6, 7 and 8. Further, signaling among the semiconductor memory devices 11, 12, 13 and 14 is performed through buses 1, 2, 3, 4, 5, 6, 7 and 8. In the conventional memory system shown in FIG. 1, the signaling is performed through all of the buses 1, 2, 3, 4, 5, 6, 7 and 8 in a differential signaling mode.

Signaling in the differential signaling mode through all of the buses increases the power consumption of the memory system.

SUMMARY OF THE INVENTION

Accordingly, the present invention is provided to substantially obviate one or more problems due to limitations and disadvantages of the related art.

According to a first aspect, the invention is directed to a memory system comprising a memory module configured to have at least one semiconductor memory device; and a memory controller configured to set a signaling mode based on stack position information of each of the semiconductor memory devices.

In one embodiment, signaling between the memory controller and each of the semiconductor memory devices is performed in a differential signaling mode, and signaling among the semiconductor memory devices is performed in a single-ended signaling mode. In one embodiment, the memory controller determines the signaling mode using identifiers that correspond to each of the semiconductor memory devices. In one embodiment, the memory module includes: a first semiconductor memory device configured to receive a first packet in the differential signaling mode through a first port from the memory controller, configured to output the first packet through a second port, and configured to output first read data through a third port; a second semiconductor memory device coupled to the first semiconductor memory device, the second semiconductor memory device configured to receive the first packet in the single-ended signaling mode through a fourth port, configured to receive the first read data in the single-ended signaling mode through a fifth port, configured to output second read data through a sixth port, and configured to transmit the second read data to the memory controller in the differential signaling mode; a third semiconductor memory device coupled to the first semiconductor memory device, the third semiconductor memory device configured to receive the first packet in the single-ended signaling mode through a seventh port, configured to output the first packet through an eighth port, and configured to output third read data through a ninth port; and a fourth semiconductor memory device coupled to the third semiconductor memory device, the fourth semiconductor memory device configured to receive the first packet in the single-ended signaling mode through a tenth port, configured to receive the third read data in the single-ended signaling mode through an eleventh port, configured to output the fourth read data through a twelfth port, and configured to transmit the fourth read data to the memory controller in the differential signaling mode. In one embodiment, the first packet is merged data that includes read data, a command and an address. In one embodiment, the first semiconductor memory device and the third semiconductor memory device have the same rank, and the second semiconductor memory device and the fourth semiconductor memory device have the same rank.

In one embodiment, the memory module includes: a first semiconductor memory device configured to receive a first packet in the differential signaling mode through a first port from the memory controller, configured to output the first packet through a second port, configured to output first read data through a third port, and configured to transmit the first read data to the memory controller in the differential signaling mode; and a second semiconductor memory device coupled to the first semiconductor memory device, the second semiconductor memory device configured to receive the first packet in the single-ended signaling mode through a fourth port, configured to output the second read data through a fifth port, and configured to transmit the second read data to the memory controller in the differential signaling mode. In one embodiment, the first packet is merged data that includes read data, a command and an address. In one embodiment, the first semiconductor memory device and the second semiconductor memory device have the same rank.

In one embodiment, the memory module includes: a first semiconductor memory device configured to receive a first packet in the differential signaling mode through a first port from the memory controller, configured to output first read data through a second port, and configured to transmit the first read data to the memory controller in the differential signaling mode; and a second semiconductor memory device coupled to the memory controller, the second semiconductor memory device configured to receive the first packet in the differential signaling mode through a third port, configured to output second read data through a fourth port, and configured to transmit the second read data to the memory controller in the differential signaling mode. In one embodiment, the first packet is merged data that includes read data, a command and an address. In one embodiment, the first semiconductor memory device and the second semiconductor memory device have the same rank.

In one embodiment, the memory module includes: a first semiconductor memory device configured to receive a first packet in the differential signaling mode through a first port from the memory controller, configured to output the first packet through a second port, and configured to output first read data through a third port; a second semiconductor memory device coupled to the first semiconductor memory device, the second semiconductor memory device configured to receive the first packet in the single-ended signaling mode through a fourth port, configured to receive the first read data in the single-ended signaling mode through a fifth port, configured to output second read data through a sixth port, and configured to transmit the second read data to the memory controller in the differential signaling mode; a third semiconductor memory device coupled to the memory controller, the third semiconductor memory device configured to receive the first packet in the differential signaling mode through a seventh port from the memory controller, configured to output the first packet through an eighth port, and configured to output third read data through a ninth port; and a fourth semiconductor memory device coupled to the third semiconductor memory device, the fourth semiconductor memory device configured to receive the first packet in the single-ended signaling mode through a tenth port, configured to receive the third read data in the single-ended signaling mode through an eleventh port, configured to output the fourth read data through a twelfth port, and configured to transmit the fourth read data to the memory controller in the differential signaling mode. In one embodiment, the first packet is merged data that includes read data, a command and an address. In one embodiment, the first semiconductor memory device and the third semiconductor memory device have the same rank, and the second semiconductor memory device and the fourth semiconductor memory device have the same rank.

In one embodiment, the memory module includes: a first semiconductor memory device configured to receive a first packet in the differential signaling mode through a first port from the memory controller, configured to output the first packet through a second port, and configured to output first read data through a third port; a second semiconductor memory device coupled to the first semiconductor memory device, the second semiconductor memory device configured to receive the first packet in the single-ended signaling mode through a fourth port, configured to receive the first read data in the single-ended signaling mode through a fifth port, and configured to output second read data through a sixth port. a third semiconductor memory device coupled to the first semiconductor memory device and the second semiconductor memory device, the third semiconductor memory device configured to receive the first packet in the single-ended signaling mode through a seventh port, configured to receives the second read data in the single-ended signaling mode through an eighth port, and configured to output third read data through a ninth port; a fourth semiconductor memory device coupled to the third semiconductor memory device, the fourth semiconductor memory device configured to receive the first packet in the single-ended signaling mode through a tenth port, configured to receive the third read data in the single-ended signaling mode through an eleventh port, configured to output fourth read data through a twelfth port, and configured to transmit the fourth read data to the memory controller in the differential signaling mode; a fifth semiconductor memory device configured to receive a first packet in the differential signaling mode through a thirteenth port from the memory controller, configured to output the first packet through a fourteenth port, and configured to output fifth read data through a fifteenth port; a sixth semiconductor memory device coupled to the fifth semiconductor memory device, the sixth semiconductor memory device configured to receive the first packet in the single-ended signaling mode through a sixteenth port, configured to receive the fifth read data in the single-ended signaling mode through a seventeenth port, configured to output sixth read data through a eighteenth port, and configured to transmit the sixth read data to the memory controller in the differential signaling mode; a seventh semiconductor memory device coupled to the fifth semiconductor memory device and the sixth semiconductor memory device, the seventh semiconductor memory device configured to receive the first packet in the single-ended signaling mode through a nineteenth port, configured to receive the sixth read data in the single-ended signaling mode through an twentieth port, and configured to output seventh read data through a twenty-first port; and an eighth semiconductor memory device coupled to the fifth semiconductor memory device and the seventh semiconductor memory device, the eighth semiconductor memory device configured to receive the first packet in the single-ended signaling mode through a twenty-second port from the fifth semiconductor memory device, configured to receive the seventh read data in the single-ended signaling mode through an twenty-third port, configured to output eighth read data through a twenty-fourth port, and configured to transmit the eighth read data to the memory controller in the differential signaling mode. In one embodiment, the first packet is merged data that includes read data, a command and an address. In one embodiment, the first semiconductor memory device and the fifth semiconductor memory device have the same rank, the second semiconductor memory device and the sixth semiconductor memory device have the same rank, the third semiconductor memory device and the seventh semiconductor memory device have the same rank, and the fourth semiconductor memory device and the eighth semiconductor memory device have the same rank.

In one embodiment, the memory module includes: a semiconductor memory device configured to receive a first packet in the differential signaling mode through a first port from the memory controller, configured to output first read data through a second port, configured to output second read data through a third port, and configured to transmit the first read data and the second read data to the memory controller in the differential signaling mode. In one embodiment, the first packet is merged data that includes read data, a command and an address.

In one embodiment, the memory module includes: a first semiconductor memory device configured to receive a first packet in the differential signaling mode through a first port from the memory controller, configured to output the first packet through a second port, configured to receive first read data through a third port in the single-ended signaling mode, configured to output second read data through a fourth port, and configured to transmit the second read data to the memory controller in the differential signaling mode; a second semiconductor memory device coupled to the first semiconductor memory device, the second semiconductor memory device configured to receive the first packet in the single-ended signaling mode through a fifth port from the first semiconductor memory device, configured to receive the third read data in the single-ended signaling mode through a sixth port, and configured to output the first read data through a seventh port; a third semiconductor memory device coupled to the first semiconductor memory device and the second semiconductor memory device, the third semiconductor memory device configured to receive the first packet in the single-ended signaling mode through an eighth port from the first semiconductor memory device, configured to receive fourth read data in the single-ended signaling mode through a ninth port, and configured to output the third read data through a tenth port; a fourth semiconductor memory device coupled to the first semiconductor memory device and the third semiconductor memory device, the fourth semiconductor memory device configured to receive the first packet in the single-ended signaling mode through an eleventh port from the first semiconductor memory device, and configured to output the fourth read data through a twelfth port; a fifth semiconductor memory device configured to receive a first packet in the differential signaling mode through a thirteenth port from the memory controller, the fifth semiconductor memory device configured to output the first packet through a fourteenth port, configured to receive fifth read data through a fifteenth port in the single-ended signaling mode, configured to output sixth read data through a sixteenth port, and configured to transmit the sixth read data to the memory controller in the differential signaling mode; a sixth semiconductor memory device coupled to the fifth semiconductor memory device, the sixth semiconductor memory device configured to receive the first packet in the single-ended signaling mode through a seventeenth port from the fifth semiconductor memory device, configured to receive the seventh read data in the single-ended signaling mode through an eighteenth port, and configured to output the fifth read data through a nineteenth port; a seventh semiconductor memory device coupled to the fifth semiconductor memory device and the sixth semiconductor memory device, the seventh semiconductor memory device configured to receive the first packet in the single-ended signaling mode through an twentieth port from the fifth semiconductor memory device, configured to receive eighth read data in the single-ended signaling mode through a twenty-first port, and configured to output the seventh read data through a twenty-second port; and an eighth semiconductor memory device coupled to the fifth semiconductor memory device and the seventh semiconductor memory the device, eighth semiconductor memory device configured to receive the first packet in the single-ended signaling mode through a twenty-third port from the fifth semiconductor memory device, and configured to output the eighth read data through a twenty-fourth port. In one embodiment, the first packet is merged data that includes read data, a command and an address. In one embodiment, the first semiconductor memory device and the fifth semiconductor memory device have the same rank, the second semiconductor memory device and the sixth semiconductor memory device have the same rank, the third semiconductor memory device and the seventh semiconductor memory device have the same rank, and the fourth semiconductor memory device and the eighth semiconductor memory device have the same rank.

In one embodiment, the memory module includes: a first semiconductor memory device configured to receive a first packet in the differential signaling mode through a first port from the memory controller, configured to output the first packet through a second port, configured to receive first read data through a third port in the single-ended signaling mode, configured to output second read data through a fourth port, and configured to transmit the second read data to the memory controller in the differential signaling mode; a second semiconductor memory device coupled to the first semiconductor memory device, the second semiconductor memory device configured to receive the first packet in the single-ended signaling mode through a fifth port from the first semiconductor memory device, and configured to output the first read data through a sixth port; a third semiconductor memory device coupled to the first semiconductor memory device, the third semiconductor memory device configured to receive the first packet in the single-ended signaling mode through a seventh port from the first semiconductor memory device, configured to output the first packet through an eighth port, configured to receive third read data in the single-ended signaling mode through a ninth port, configured to output fourth read data through a tenth port, and configured to transmit the fourth read data to the memory controller in the differential signaling mode; and a fourth semiconductor memory device coupled to the third semiconductor memory device, the fourth semiconductor memory device configured to receive the first packet in the single-ended signaling mode through an eleventh port from the third semiconductor memory device, and configured to output the third read data through a twelfth port. In one embodiment, the first packet is merged data that includes read data, a command and an address. In one embodiment, the first semiconductor memory device and the third semiconductor memory device have the same rank, and the second semiconductor memory device and the fourth semiconductor memory device have the same rank.

In one embodiment, the memory module includes: a first semiconductor memory device configured to receive a first packet in the differential signaling mode through a first port from the memory controller, configured to output the first packet through a second port, and configured to output first read data through a third port; a second semiconductor memory device coupled to the first semiconductor memory device, the second semiconductor memory device configured to receive the first packet in the single-ended signaling mode through a fourth port, configured to receive the first read data in the single-ended signaling mode through a fifth port, configured to output second read data through a sixth port, and configured to transmit the second read data to the memory controller in the differential signaling mode; a third semiconductor memory device coupled to the memory controller, the third semiconductor memory device configured to receive the first packet in the differential signaling mode through a seventh port from the memory controller, and configured to output third read data through an eighth port; and a fourth semiconductor memory device coupled to the first semiconductor memory device and the third semiconductor memory device, the fourth semiconductor memory device configured to receive the first packet in the single-ended signaling mode through a ninth port from the first semiconductor memory device, configured to receive the third read data in the single-ended signaling mode through a tenth port, configured to output fourth read data through an eleventh port, and configured to transmit the fourth read data to the memory controller in the differential signaling mode. In one embodiment, the first packet is merged data that includes read data, a command and an address. In one embodiment, the first semiconductor memory device and the third semiconductor memory device have the same rank, and the second semiconductor memory device and the fourth semiconductor memory device have the same rank.

In one embodiment, the memory module includes: a first semiconductor memory device configured to receive a first packet in the differential signaling mode through a first port from the memory controller, configured to output the first packet through a second port, configured to receive first read data through a third port in the single-ended signaling mode, configured to output second read data through a fourth port, and configured to transmit the second read data to the memory controller in the differential signaling mode; a second semiconductor memory device coupled to the first semiconductor memory device, the second semiconductor memory device configured to receive the first packet in the single-ended signaling mode through a fifth port from the first semiconductor memory device, and configured to output the first read data through a sixth port; a third semiconductor memory device coupled to the memory controller, the third semiconductor memory device configured to receive the first packet in the differential signaling mode through a seventh port from the memory controller, configured to receive third read data in the single-ended signaling mode through an eighth port, configured to output fourth read data through a ninth port, and configured to transmit the fourth read data to the memory controller in the differential signaling mode; and a fourth semiconductor memory device coupled to the first semiconductor memory device, the fourth semiconductor memory device configured to receive the first packet in the single-ended signaling mode through a tenth port from the first semiconductor memory device, and configured to output the third read data through an eleventh port. In one embodiment, the first packet is merged data that includes read data, a command and an address. In one embodiment, the first semiconductor memory device and the third semiconductor memory device have the same rank, and the second semiconductor memory device and the fourth semiconductor memory device have the same rank.

According to another aspect, the invention is directed to a memory system comprising: a memory controller; and a memory module including at least one semiconductor memory device, the memory module configured to perform signaling in a differential signaling mode between the memory controller and each of the semiconductor memory devices and configured to perform signaling in a single-ended signaling mode among semiconductor memory devices. In one embodiment, the memory controller determines the signaling mode based on stack position information of each of the semiconductor memory devices.

In one embodiment, the memory controller determines the signaling mode using identifiers that corresponds to each of the semiconductor memory devices.

According to another aspect, the present invention is directed to a signaling method in a memory system comprising: determining a signaling mode based on stack position information of each of the semiconductor memory devices; and transmitting a signal in response to the signaling mode.

In one embodiment, the determining a signaling mode comprises: assigning identifiers to each of the semiconductor memory devices; setting signaling mode of channels based on the identifiers corresponding to the semiconductor memory devices; performing a reverse swizzling with respect to the channels; and providing set values of signaling mode to the semiconductor memory devices.

Therefore, the memory system may selectively set signaling modes based on stack position information and may have low power consumption.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Preferred embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
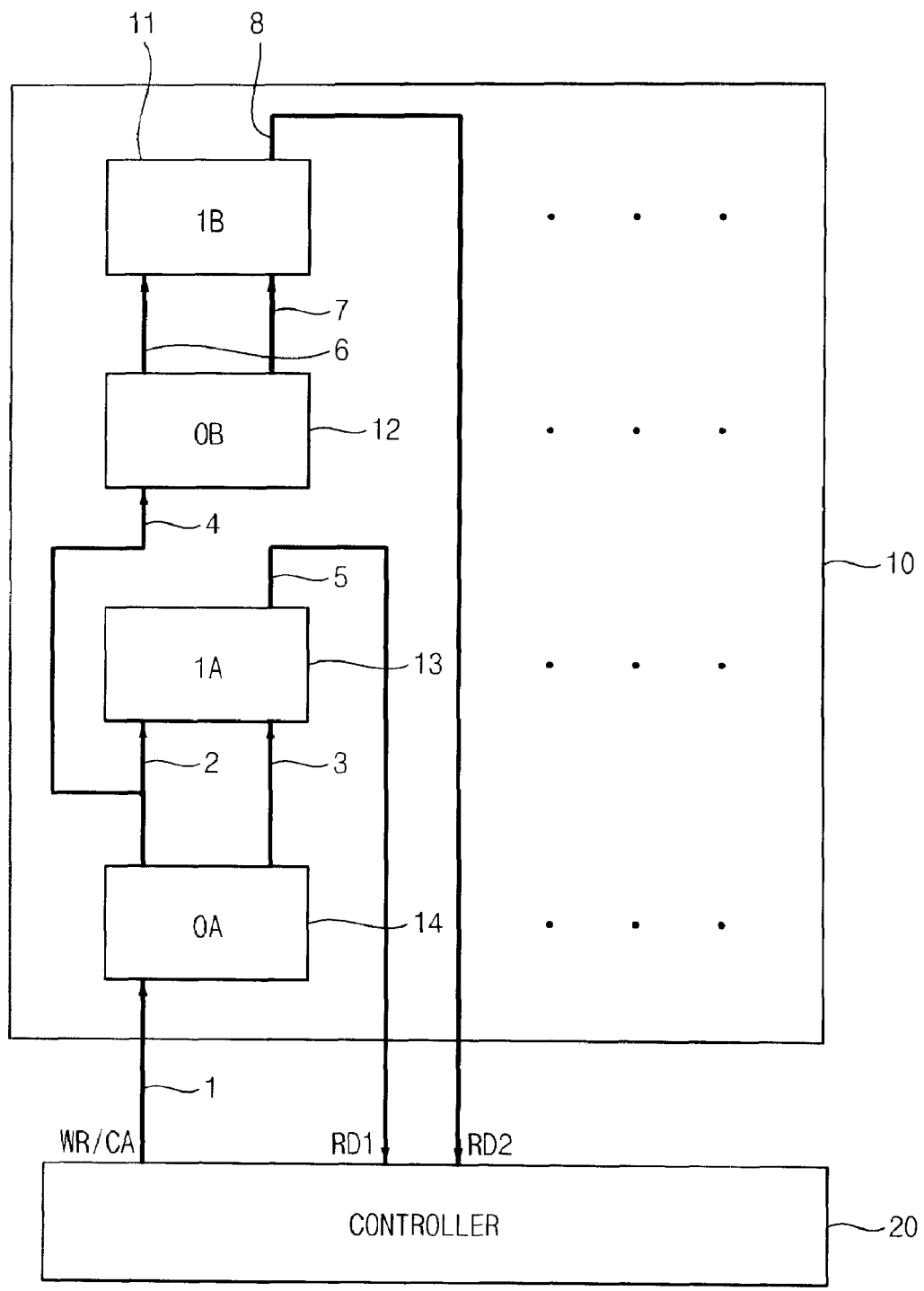
FIG. 1 is a block diagram illustrating a conventional memory system.
Figure 2:
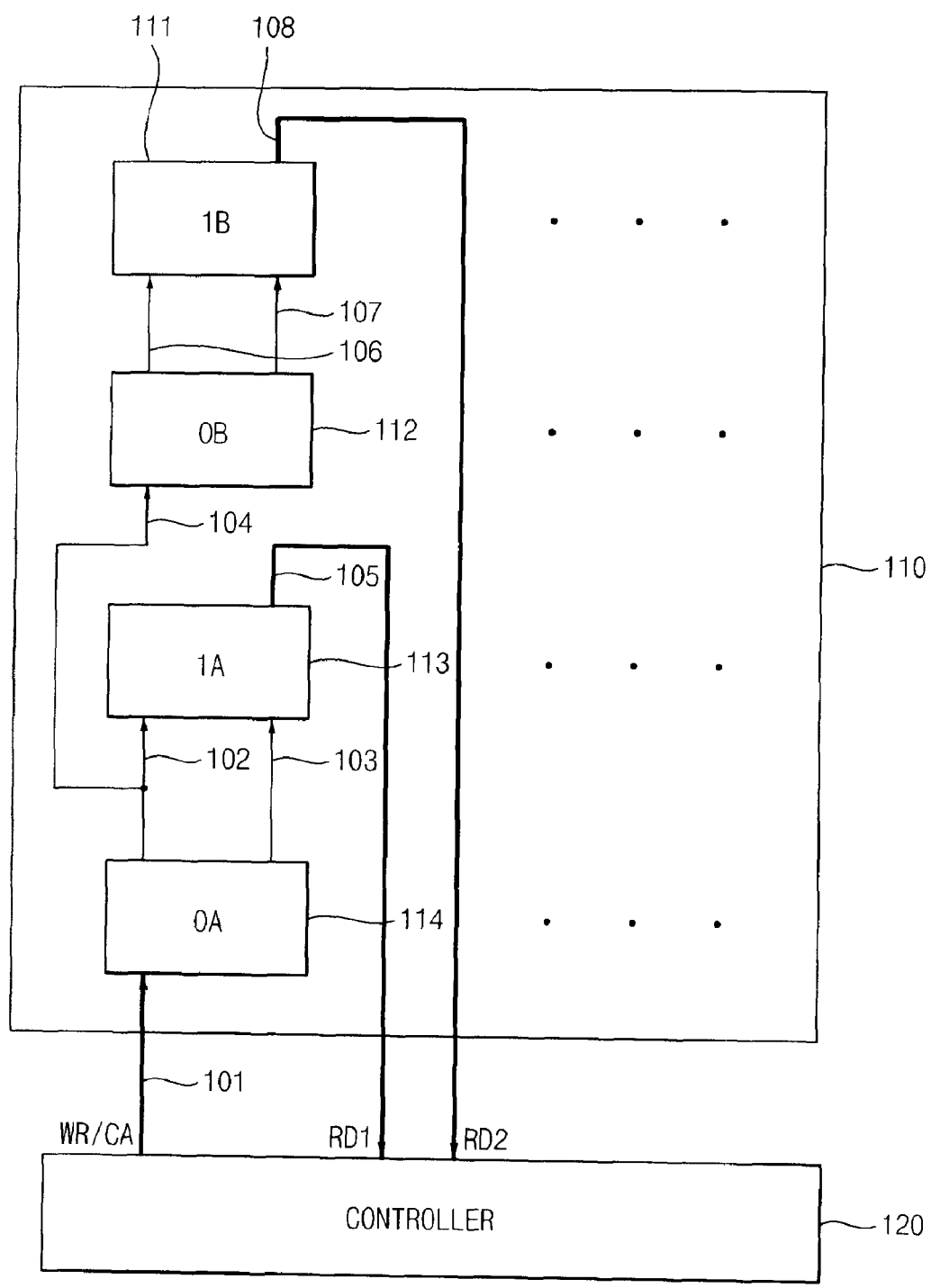
FIG. 2 is a block diagram illustrating a memory system according to a first example embodiment of the present invention.

FIG. 2 is a block diagram illustrating a memory system 100 according to a first example embodiment of the present invention.

Referring to FIG. 2, the memory system 100 includes a memory module 110 and a memory controller 120.

The memory module 110 includes a first semiconductor memory device (0A) 114, a second semiconductor memory device (1A) 113, a third semiconductor memory device (0B) 112 and a fourth semiconductor memory device (1B) 111. The memory controller 120 sets a signaling mode based on stack position information of each of the semiconductor memory devices 111, 112, 113 and 114.

Signaling between the memory controller 120 and each of the semiconductor memory devices 111, 112, 113 and 114 is performed in a differential signaling mode, and signaling among the semiconductor memory devices 111, 112, 113 and 114 is performed in a single-ended signaling mode.

In FIG. 2, a bus drawn with a thick line represents a bus in which signaling is performed in a differential signaling mode, and a bus drawn with a thin line represents a bus in which signaling is performed in a single-ended signaling mode.

The first semiconductor memory device (0A) 114 receives a first packet WR/CA in the differential signaling mode through a first port (not shown) from the memory controller, outputs the first packet through a second port (not shown), and outputs first read data through a third port (not shown). The first port is electrically coupled to the memory controller 120 through a first bus 101.

The second semiconductor memory device (1A) 113 is coupled to the first semiconductor memory device (0A) 114. The second semiconductor memory device (1A) 113 receives the first packet WR/CA in the single-ended signaling mode through a fourth port (not shown) and receives the first read data in the single-ended signaling mode through a fifth port (not shown). Further, the second semiconductor memory device (1A) 113 outputs second read data RD1 through a sixth port (not shown) and transmits the second read data RD1 to the memory controller 120 in the differential signaling mode. The second port and the fourth port are electrically coupled to each other through a second bus 102, and the third port and the fifth port are electrically coupled to each other through a third bus 103. The sixth port is electrically coupled to the memory controller 120 through a fourth bus 105.

The third semiconductor memory device (0B) 112 is coupled to the first semiconductor memory device (0A) 114. The third semiconductor memory device (0B) 112 receives the first packet WR/CA in the single-ended signaling mode through a seventh port (not shown). Further, the third semiconductor memory device (0B) 112 outputs the first packet WR/CA through an eighth port (not shown) and outputs third read data through a ninth port (not shown). The seventh port and the second port are electrically coupled to each other through a fifth bus 104.

The fourth semiconductor memory device (1B) 111 is coupled to the third semiconductor memory device (0B) 112. The fourth semiconductor memory device (1B) 111 receives the first packet WR/CA in the single-ended signaling mode through a tenth port (not shown), and receives the third read data in the single-ended signaling mode through an eleventh port (not shown). Further, the fourth semiconductor memory device (1B) 111 outputs fourth read data RD2 through a twelfth port (not shown), and transmits the fourth read data RD2 to the memory controller 120 in the differential signaling mode. The eighth port and the tenth port are electrically coupled to each other through a sixth bus 106. The ninth port and the eleventh port are electrically coupled to each other through a seventh bus 107. The twelfth port is electrically coupled to the memory controller 120 through an eighth bus 108.

In FIG. 2, "0A" and "0B" are twins and represent semiconductor memory devices having a rank of zero. Further, "1A" and "1B" are twins and represent semiconductor memory devices having a rank of one.

The first packet WR/CA is mixed data of write data, commands and addresses.

Figure 3:
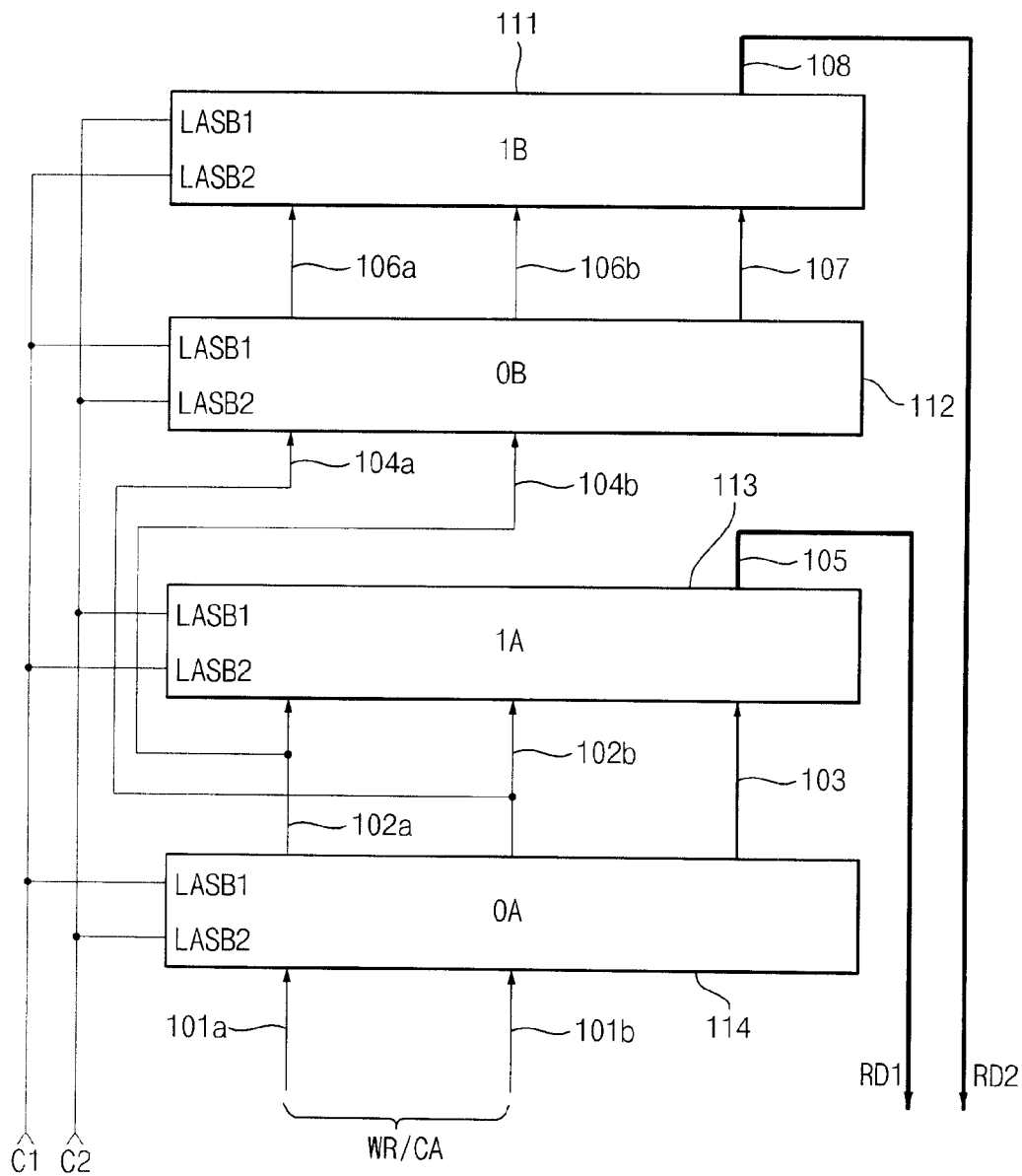
FIG. 3 is a block diagram illustrating a method of identifying semiconductor memory devices included in the memory system shown in FIG. 2.

FIG. 3 is a block diagram illustrating a method of identifying semiconductor memory devices included in the memory system 100 shown in FIG. 2.

In FIG. 3, each of the semiconductor memory devices 111, 112, 113 and 114 has a first control pin LASB1 and a second control pin LASB2. The bus 101 shown in FIG. 2 may include a first sub-bus 101a and a second sub-bus 101b. The bus 102 shown in FIG. 2 may include a third sub-bus 102a and a fourth sub-bus 102b. The bus 104 shown in FIG. 2 may include a fifth sub-bus 104a and a sixth sub-bus 104b. The bus 106 shown in FIG. 2 may include a seventh sub-bus 106a and an eighth sub-bus 106b.

The first control signal C1 is inputted to the first control pin LASB1 of the first semiconductor memory device (0A) 114 and the third semiconductor memory device (0B) 112. The first semiconductor memory device (0A) 114 and the third semiconductor memory device (0B) 112 have the same rank as each other. Further, the control signal C1 is inputted to the second control pin LASB2 of the second semiconductor memory device (1A) 113 and the fourth semiconductor memory device (1B) 111. The second semiconductor memory device (1A) 113 and the fourth semiconductor memory device (1B) 111 have the same rank as each other.

The second control signal C2 is inputted to the second control pin LASB2 of the first semiconductor memory device (0A) 114 and the third semiconductor memory device (0B) 112. Further, the second control signal C2 is inputted to the first control pin LASB1 of the second semiconductor memory device (1A) 113 and the fourth semiconductor memory device (1B) 111. Accordingly, a rank of each of the semiconductor memory devices 111, 112, 113 and 114 may be determined by inputting the control signals C1 and C2.

The first packet WR/CA is inputted to the first semiconductor memory device (0A) 114 through the first sub-bus 101a and the second sub-bus 101b, and outputted from the first semiconductor memory device (0A) 114 through the third sub-bus 102a and the fourth sub-bus 102b. Further, the first packet WR/CA is inputted to the second semiconductor memory device (1A) 113 through the third sub-bus 102a and the fourth sub-bus 102b. Further, the first packet WR/CA is inputted to the third semiconductor memory device (0B) 112 through the fifth sub-bus 104a and the sixth sub-bus 104b, and outputted from the third semiconductor memory device (0B) 112 through the seventh sub-bus 106a and the eighth sub-bus 106b. Further, the first packet WR/CA is inputted to the fourth semiconductor memory device (1B) 111 through the seventh sub-bus 106a and the eighth sub-bus 106b.

In FIG. 3, the sub-buses 101a, 102a, 104a and 106a are coupled to ports which are located at the same position as each of the semiconductor memory devices 111, 112, 113 and 114. Further, the sub-buses 101b, 102b, 104b and 106b are coupled to ports which are located at the same position as each of the semiconductor memory devices 111, 112, 113 and 114. The first packet WR/CA that is outputted from the first semiconductor memory device (0A) 114 is inputted to the second semiconductor memory device (1A) 113 through a pin that is located at the same position as the second semiconductor memory device (1A) 113 as a pin of the first semiconductor memory device (0A) 114.

However, the fifth sub-bus 104a and the sixth sub-bus 104b are twisted to be coupled to the third sub-bus 102a and the fourth sub-bus 102b respectively. This process is called "swizzling." The fifth sub-bus 104a is coupled to the fourth sub -bus 102b, and the sixth sub-bus 104b is coupled to the third sub-bus 102a. Therefore, the first packet WR/CA that is outputted from the first semiconductor memory device (0A) 114 is inputted to the third semiconductor memory device (0B) 112 through a pin that is located at a different position of the third semiconductor memory device (0B) 112 from a pin of the first semiconductor memory device (0A) 114.

For example, a signal received through the sub-bus 101a is inputted to the second semiconductor memory device (1A) 113 through the third sub-bus 102a and to the third semiconductor memory device (0B) 112 through the sixth sub-bus 104b. Further, a signal received through the sub-bus 101b is inputted to the second semiconductor memory device (1A) 113 through the fourth sub-bus 102b and to the third semiconductor memory device (0B) 112 through the fifth sub-bus 104a.

Accordingly, the first packet WR/CA is inputted to the first semiconductor memory device (0A) 114 and to the second semiconductor memory device (1A) 113 through the pin that is located at the same position as each of the semiconductor memory devices 114 and 113. However, the first packet WR/CA is inputted to the first semiconductor memory device (0A) 114 and to the third semiconductor memory device (0B) 112 through the pin that is located at a different position of each of the semiconductor memory devices 114 and 112.

As the memory system 100 shown in FIG. 2 has the swizzling approach, "0A" and "0B" may be distinguished from each other and "1A" and "1B" may be distinguished from each other. Therefore, the memory system 100 shown in FIG. 2 may distinguish among ranks of the semiconductor memory devices 111, 112, 113 and 114 by the control signals C1 and C2, and may distinguish between "A" and "B" by the swizzling. The semiconductor memory devices having the same rank operate at the same time in response to commands.

Figure 4:
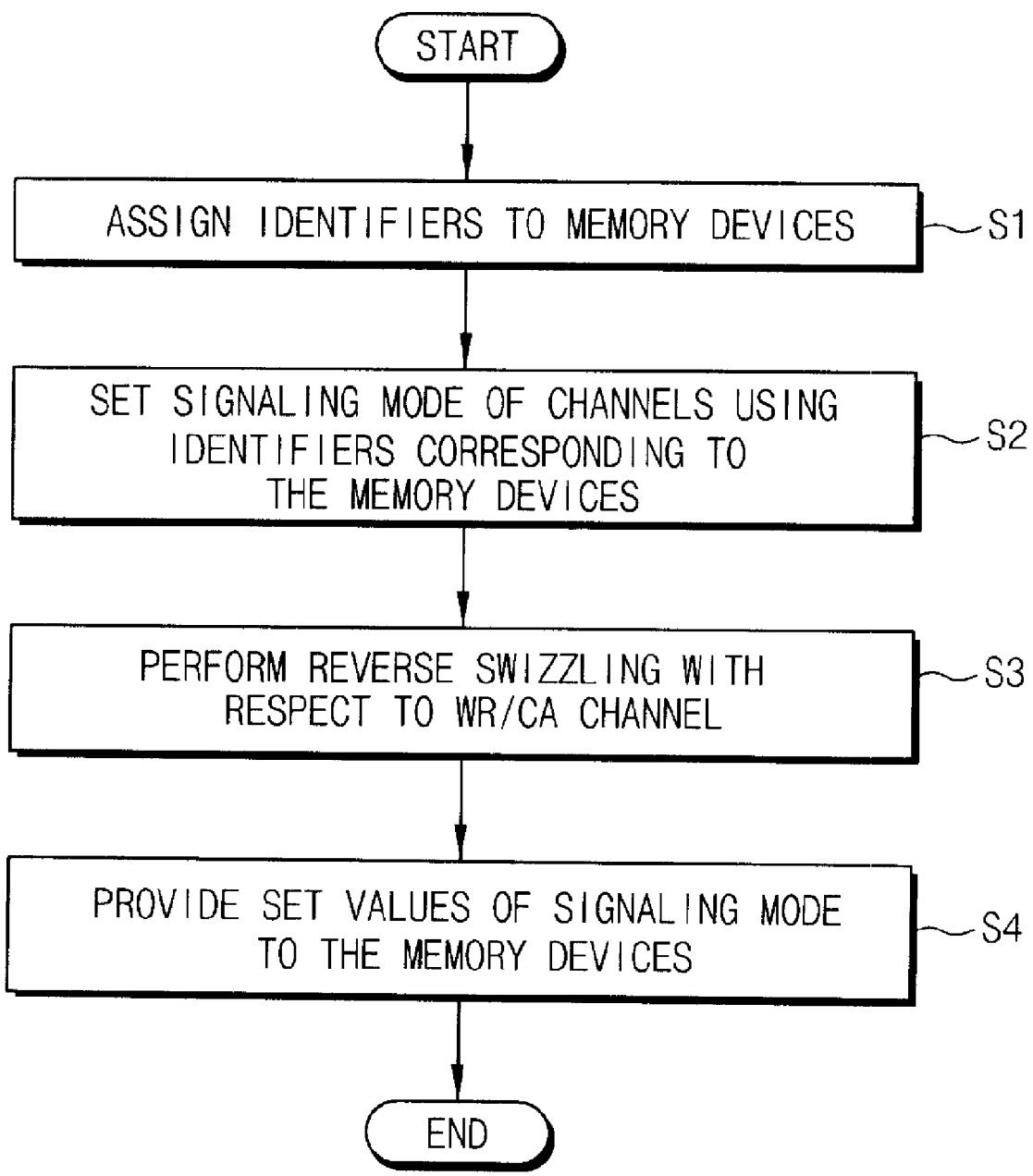
FIG. 4 is a flow chart illustrating a method of setting a signaling mode of a memory system shown in FIG. 2.

FIG. 4 is a flow chart illustrating a method of setting a signaling mode of a memory system shown in FIG. 2.

A memory controller sets a signaling mode based on stack position information of each of the semiconductor memory devices.

Referring to FIG. 4, steps for setting the signaling mode may include assigning identifiers to each of the semiconductor memory devices (step S1), setting signaling mode of channels based on identifiers corresponding to the semiconductor memory devices (step S2), performing a reverse swizzling with respect to the channels (step S3), and providing set values of signaling mode to the semiconductor memory devices (step S4).

Figure 5:
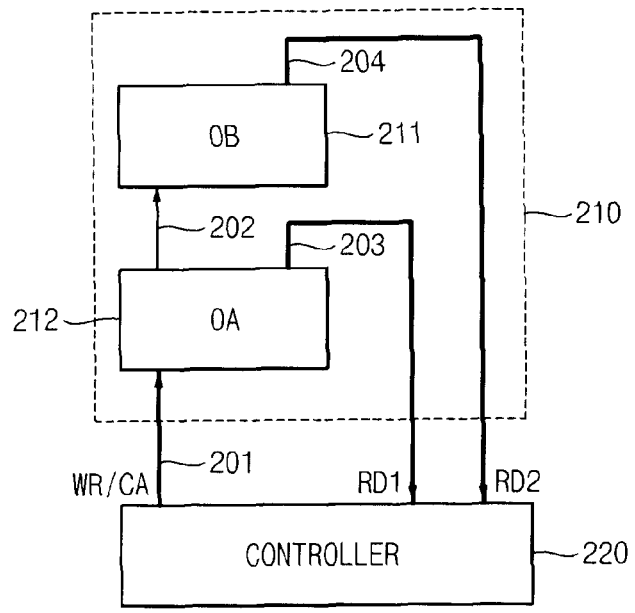
FIGS. 5 through 13 are block diagrams illustrating memory systems according to second through tenth example embodiments of the present invention.

FIG. 5 is a block diagram illustrating a memory system 200 according to a second example embodiment of the present invention.

Referring to FIG. 5, the memory system 200 includes a memory module 210 and a memory controller 220.

The memory module 210 includes a first semiconductor memory device (0A) 212 and a second semiconductor memory device (0B) 211. The memory controller 220 sets a signaling mode based on stack position information of each of the semiconductor memory devices 211 and 212. In FIG. 5, a bus drawn with a thick line represents a bus in which signaling is performed in a differential signaling mode, and a bus drawn with a thin line represents a bus in which signaling is performed in a single-ended signaling mode.

The first semiconductor memory device (0A) 212 receives a first packet WR/CA in the differential signaling mode through a first port (not shown) from the memory controller 220, Further, the first semiconductor memory device (0A) 212 outputs the first packet WR/CA through a second port (not shown), outputs first read data RD1 through a third port (not shown), and transmits the first read data RD1 to the memory controller 220 in the differential signaling mode. The first port is electrically coupled to the memory controller 220 through a first bus 201, and the third port is electrically coupled to the memory controller 220 through a third bus 203.

The second semiconductor memory device (0B) 211 is coupled to the first semiconductor memory device (0A) 212. The second semiconductor memory device (0B) 211 receives the first packet WR/CA in the single-ended signaling mode through a fourth port (not shown), outputs the second read data RD2 through a fifth port (not shown), and transmits the second read data RD2 to the memory controller 220 in the differential signaling mode. The second port and the fourth port are electrically coupled to each other through a second bus 202, and the fifth port is electrically coupled to the memory controller 220 through a fourth bus 204.

The first packet WR/CA is mixed data of write data, commands and addresses.

Figure 6:
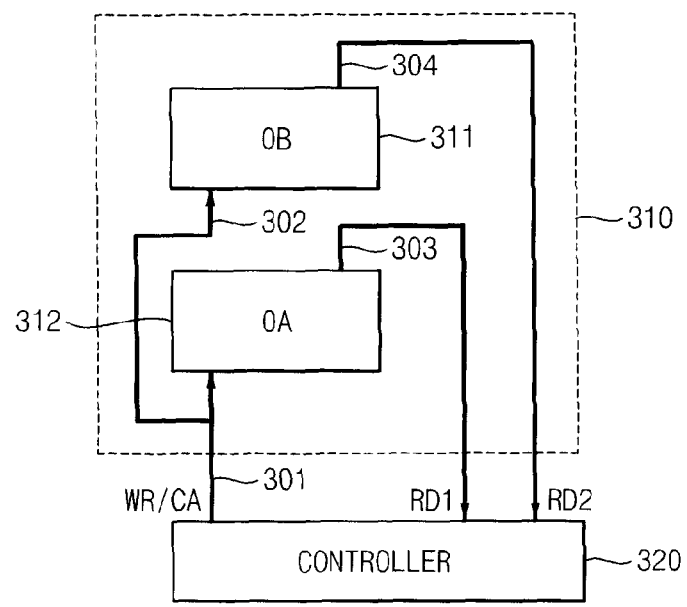

FIG. 6 is a block diagram illustrating a memory system according to a third example embodiment of the present invention.

Referring to FIG. 6, the memory system 300 includes a memory module 310 and a memory controller 320.

The memory module 310 includes a first semiconductor memory device (0A) 312 and a second semiconductor memory device (0B) 311. The memory controller 320 sets a signaling mode based on stack position information of each of the semiconductor memory devices 311 and 312. In FIG. 5, a bus drawn with a thick line represents a bus in which signaling is performed in a differential signaling mode.

The first semiconductor memory device (0A) 312 receives a first packet WR/CA in the differential signaling mode through a first port (not shown) from the memory controller. The first semiconductor memory device 312 outputs first read data RD1 through a second port (not shown), and transmits the first read data RD1 to the memory controller 320 in the differential signaling mode. The first port is electrically coupled to the memory controller 320 through a first bus 301, and the second port is electrically coupled to the memory controller 320 through a second bus 303.

The second semiconductor memory device (0B) 311 is coupled to the memory controller 320. The second semiconductor memory device (0B) 311 receives the first packet WR/CA in the differential signaling mode through a third port (not shown), outputs second read data RD2 through a fourth port (not shown), and transmits the second read data RD2 to the memory controller 320 in the differential signaling mode. The third port is electrically coupled to the memory controller 320 through a third bus 302, and the fourth port is electrically coupled to the memory controller 320 through a fourth bus 304.

The first packet WR/CA is mixed data of write data, commands and addresses.

Figure 7:
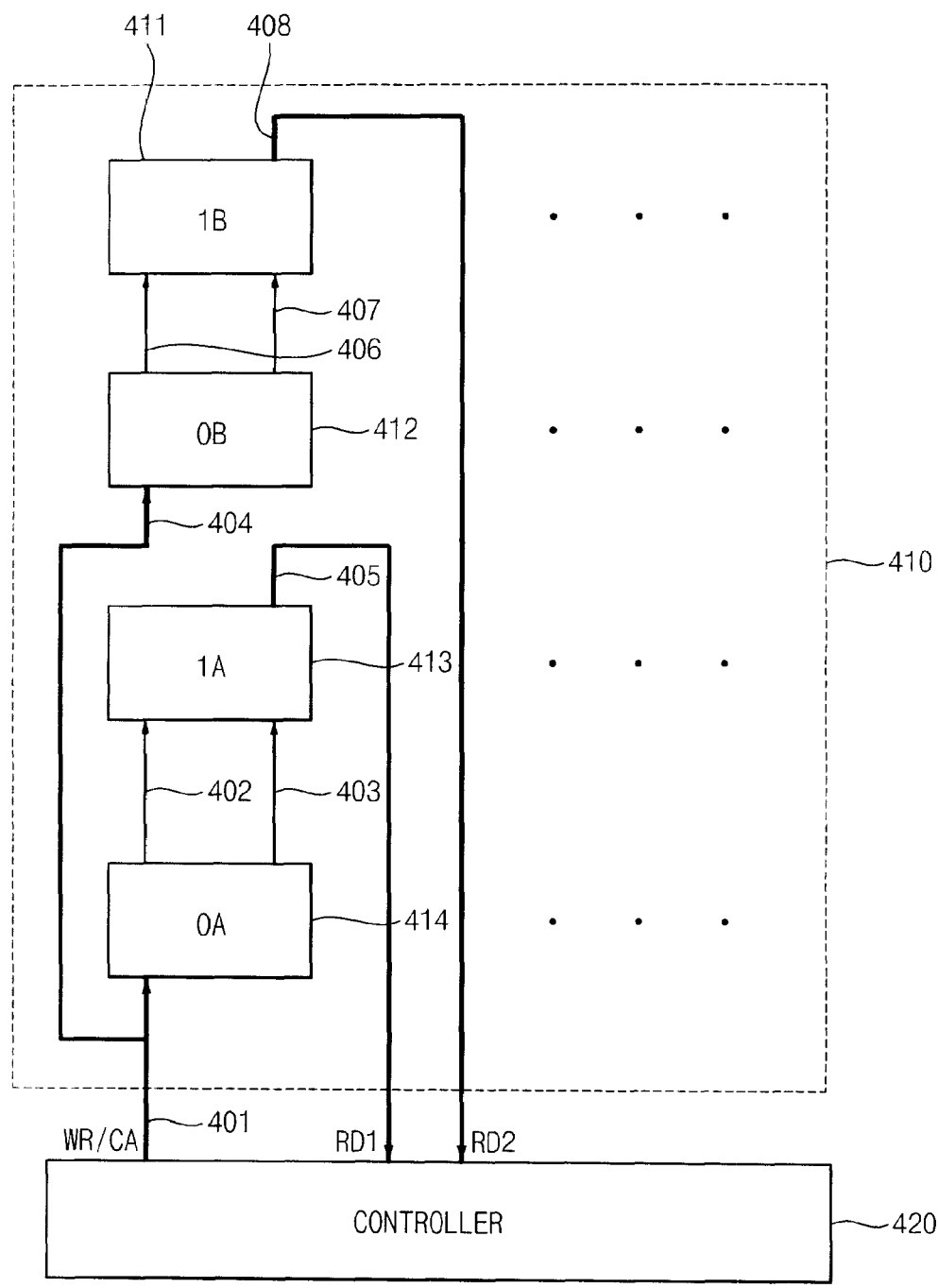

FIG. 7 is a block diagram illustrating a memory system 400 according to a fourth example embodiment of the present invention.

Referring to FIG. 7, the memory system 400 includes a memory module 410 and a memory controller 420.

The memory module 410 includes a first semiconductor memory device (0A) 414, a second semiconductor memory device (1A) 413, a third semiconductor memory device (0B) 412 and a fourth semiconductor memory device (1B) 411. The memory controller 420 sets a signaling mode based on stack position information of each of the semiconductor memory devices 411, 412, 413 and 414.

In FIG. 7, a bus drawn with a thick line represents a bus in which signaling is performed in a differential signaling mode, and a bus drawn with a thin line represents a bus in which signaling is performed in a single-ended signaling mode.

The first semiconductor memory device (0A) 414 receives a first packet WR/CA in the differential signaling mode through a first port (not shown) from the memory controller 420, outputs the first packet WR/CA through a second port (not shown), and outputs first read data through a third port (not shown). The first port is electrically coupled to the memory controller 420 through a first bus 401.

The second semiconductor memory device (1A) 413 is coupled to the first semiconductor memory device (0A) 414. The second semiconductor memory device (1A) 413 receives the first packet WR/CA in the single-ended signaling mode through a fourth port (not shown), receives the first read data in the single-ended signaling mode through a fifth port (not shown), outputs second read data RD1 through a sixth port (not shown), and transmits the second read data RD1 to the memory controller 420 in the differential signaling mode. The second port and the fourth port are electrically coupled to each other through a second bus 402, and the third port and the fifth port are electrically coupled to each other through a third bus 403. The sixth port is electrically coupled to the memory controller 420 through a fourth bus 405.

The third semiconductor memory device (0B) 412 is coupled to the memory controller 420. The third semiconductor memory device (0B) 412 receives the first packet WR/CA in the differential signaling mode through a seventh port (not shown) from the memory controller 420, outputs the first packet WR/CA through an eighth port (not shown), and outputs third read data through a ninth port (not shown). The seventh port and the memory controller 420 are electrically coupled to each other through a fifth bus 404.

The fourth semiconductor memory device (1B) 411 is coupled to the third semiconductor memory device (0B) 412. The fourth semiconductor memory device (1B) 411 receives the first packet WR/CA in the single-ended signaling mode through a tenth port (not shown), receives the third read data in the single-ended signaling mode through an eleventh port (not shown), outputs the fourth read data RD2 through a twelfth port (not shown), and transmits the fourth read data RD2 to the memory controller in the differential signaling mode. The eighth port and the tenth port are electrically coupled to each other through a sixth bus 406, and the ninth port and the eleventh port are electrically coupled to each other through the seventh bus 407. The twelfth port is electrically coupled to the memory controller 420 through an eighth bus 408.

The first packet WR/CA is mixed data of write data, commands and addresses.

Figure 8:
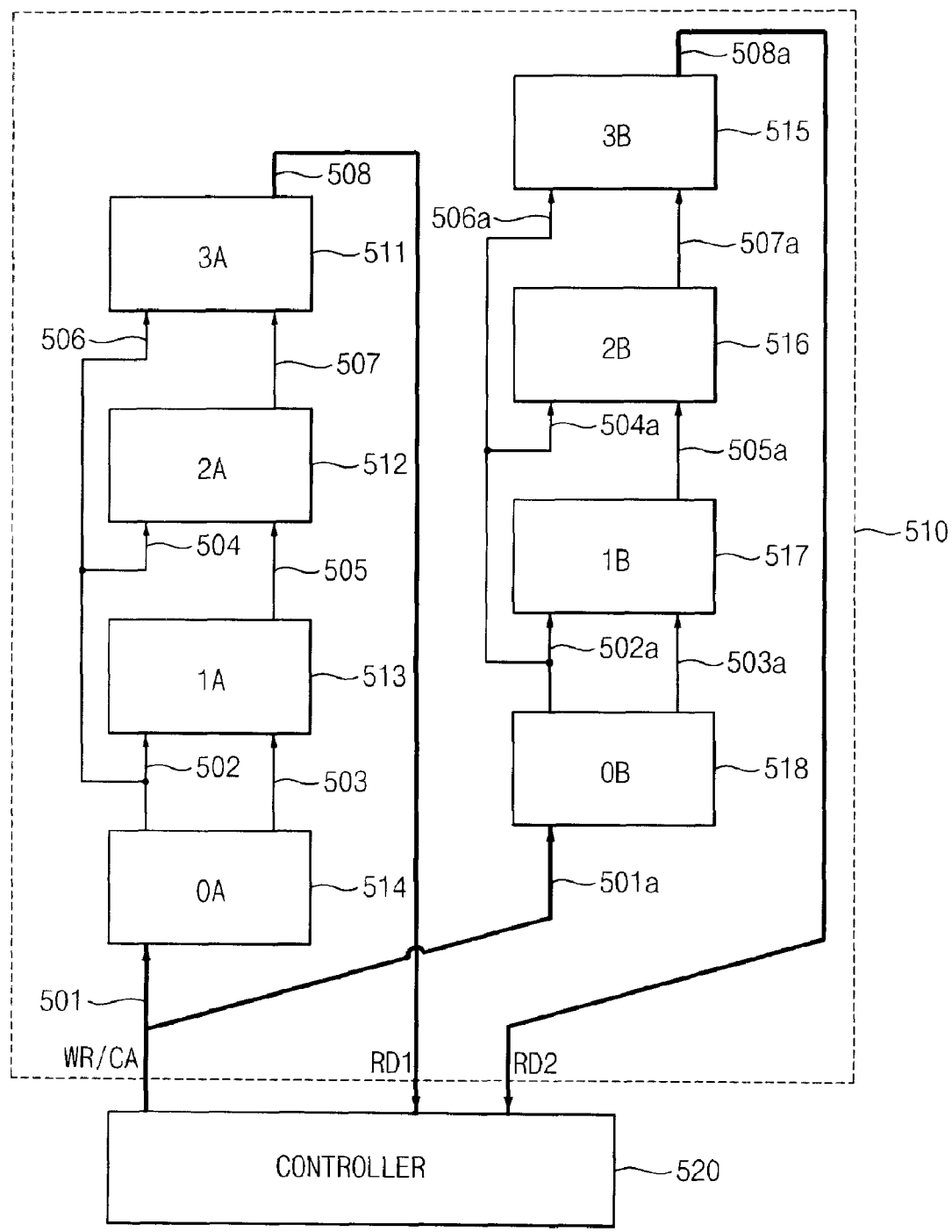

FIG. 8 is a block diagram illustrating a memory system 500 according to a fifth example embodiment of the present invention.

Referring to FIG. 8, the memory system 500 includes a memory module 510 and a memory controller 520.

The memory module 510 includes a first semiconductor memory device (0A) 514, a second semiconductor memory device (1A) 513, a third semiconductor memory device (2A) 512, a fourth semiconductor memory device (3A) 511, a fifth semiconductor memory device (0B) 518, a sixth semiconductor memory device (1B) 517, a seventh semiconductor memory device (2B) 516 and an eighth semiconductor memory device (3B) 515. The memory controller 520 sets a signaling mode based on stack position information of each of the semiconductor memory devices 511, 512, 513, 514, 515, 516, 517 and 518.

In FIG. 8, a bus drawn with a thick line represents a bus in which signaling is performed in a differential signaling mode, and a bus drawn with a thin line represents a bus in which signaling is performed in a single-ended signaling mode.

The first semiconductor memory device (0A) 514 receives a first packet WR/CA in the differential signaling mode through a first port (not shown) from the memory controller 520, outputs the first packet WR/CA through a second port (not shown), and outputs first read data through a third port (not shown). The first port is electrically coupled to the memory controller 520 through a first bus 501.

The second semiconductor memory device (1A) 513 is coupled to the first semiconductor memory device (0A) 514. The second semiconductor memory device (1A) 513 receives the first packet WR/CA in the single-ended signaling mode through a fourth port (not shown), receives the first read data in the single-ended signaling mode through a fifth port (not shown), and outputs second read data through a sixth port (not shown). The second port and the fourth port are electrically coupled to each other through a second bus 502, and the third port and the fifth port are electrically coupled to each other through a third bus 503.

The third semiconductor memory device (2A) 512 is coupled to the first semiconductor memory device (0A) 514 and the second semiconductor memory device (1A) 513. The third semiconductor memory device (2A) 512 receives the first packet WR/CA in the single-ended signaling mode through a seventh port (not shown) from the first semiconductor memory device (0A) 514, receives the second read data in the single-ended signaling mode through an eighth port (not shown), and outputs third read data through a ninth port (not shown). The seventh port and the second port are electrically coupled to each other through a fourth bus 504, and the eighth port and the sixth port are electrically coupled to each other through a fifth bus 505.

The fourth semiconductor memory device (3A) 511 is coupled to the first semiconductor memory device (0A) 514 and the third semiconductor memory device (2A) 512. The fourth semiconductor memory device (3A) 511 receives the first packet WR/CA in the single-ended signaling mode through a tenth port (not shown), receives the third read data in the single-ended signaling mode through an eleventh port (not shown), outputs fourth read data RD1 through a twelfth port (not shown), and transmits the fourth read data RD1 to the memory controller 520 in the differential signaling mode. The tenth port and the second port are electrically coupled to each other through a sixth bus 506, the eleventh port and the ninth port are electrically coupled to each other through a seventh bus 507, and the twelfth port is electrically coupled to the memory controller through an eighth bus 508.

The fifth semiconductor memory device (0B) 518 receives a first packet WR/CA in the differential signaling mode through a thirteenth port (not shown) from the memory controller 520, outputs the first packet WR/CA through a fourteenth port (not shown), and outputs fifth read data through a fifteenth port (not shown). The thirteenth port is electrically coupled to the memory controller 520 through a ninth bus 501a.

The sixth semiconductor memory device (1B) 517 is coupled to the fifth semiconductor memory device (0B) 518. The sixth semiconductor memory device (1B) 517 receives the first packet WRICA in the single-ended signaling mode through a sixteenth port (not shown), receives the fifth read data in the single-ended signaling mode through a seventeenth port (not shown), and outputs sixth read data through an eighteenth port (not shown). The fourteenth port and the sixteenth port are electrically coupled to each other through a tenth bus 502a, and the fifteenth port and the seventeenth port are electrically coupled to each other through an eleventh bus 503a.

The seventh semiconductor memory device (2B) 516 is coupled to the fifth semiconductor memory device (0B) 518 and the sixth semiconductor memory device (1B) 517. The seventh semiconductor memory device (2B) 516 receives the first packet WR/CA in the single-ended signaling mode through a nineteenth port (not shown) from the fifth semiconductor memory device (0B) 518, receives the sixth read data in the single-ended signaling mode through a twentieth port (not shown), and outputs seventh read data through a twenty-first port (not shown). The nineteenth port and the fourteenth port are electrically coupled to each other through a twelfth bus 504a, and the twentieth port and the eighteenth port are electrically coupled to each other through a thirteenth bus 505a.

The eighth semiconductor memory device (3B) 515 is coupled to the fifth semiconductor memory device (0B) 518 and the seventh semiconductor memory device (2B) 516. The eighth semiconductor memory device (3B) 515 receives the first packet WR/CA in the single-ended signaling mode through a twenty-second port (not shown), receives the seventh read data in the single-ended signaling mode through a twenty-third port (not shown), outputs a eighth read data RD2 through a twenty-fourth port (not shown), and transmits the eighth read data RD2 to the memory controller 520 in the differential signaling mode. The twenty-second port and the fourteenth port are electrically coupled to each other through a fourteenth bus 506a, the twenty-third port and the twenty-first port are electrically coupled to each other through a fifteenth bus 507a, and the twenty-fourth port is electrically coupled to the memory controller 520 through a sixteenth bus 508a.

The first packet WR/CA is mixed data of write data, commands and addresses.

Figure 9:
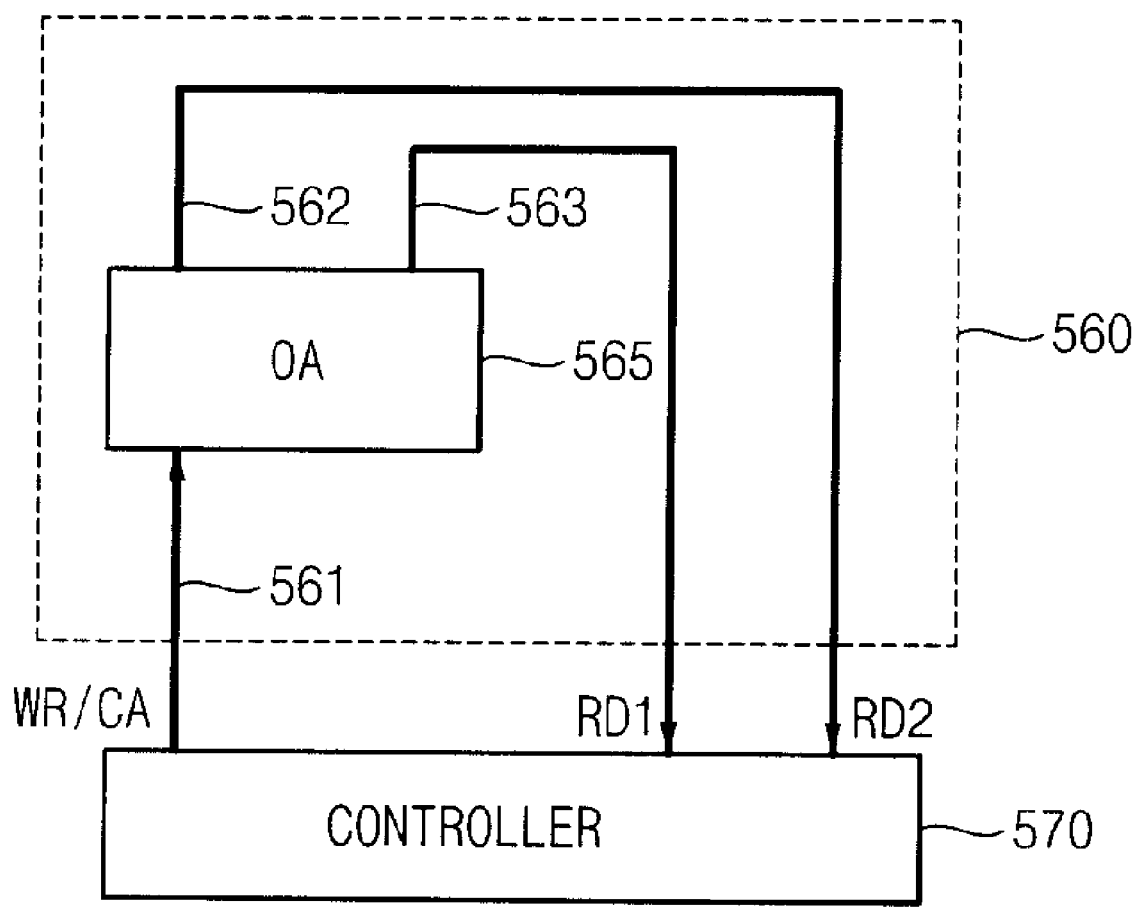

FIG. 9 is a block diagram illustrating a memory system 550 according to a sixth example embodiment of the present invention.

Referring to FIG. 9, the memory system 550 includes a memory module 560 and a memory controller 570.

The memory module 560 includes a semiconductor memory device (0A) 565. The memory controller 570 sets a signaling mode based on stack position information of the semiconductor memory device (0A) 565. In FIG. 9, a bus drawn with a thick line represents a bus in which signaling is performed in a differential signaling mode.

The semiconductor memory device (0A) 565 receives a first packet in the differential signaling mode through a first port (not shown) from the memory controller 570, outputs first read data RD1 through a second port (not shown), outputs second read data RD2 through a third port (not shown), and transmits the first read data RD1 and the second read data RD2 to the memory controller 570 in the differential signaling mode. The first port is electrically coupled to the memory controller 570 through a first bus 561, and the second port is electrically coupled to the memory controller 570 through a second bus 563, and the third port is electrically coupled to the memory controller 570 through a third bus 562.

The first packet WR/CA is mixed data of write data, commands and addresses.

Figure 10:
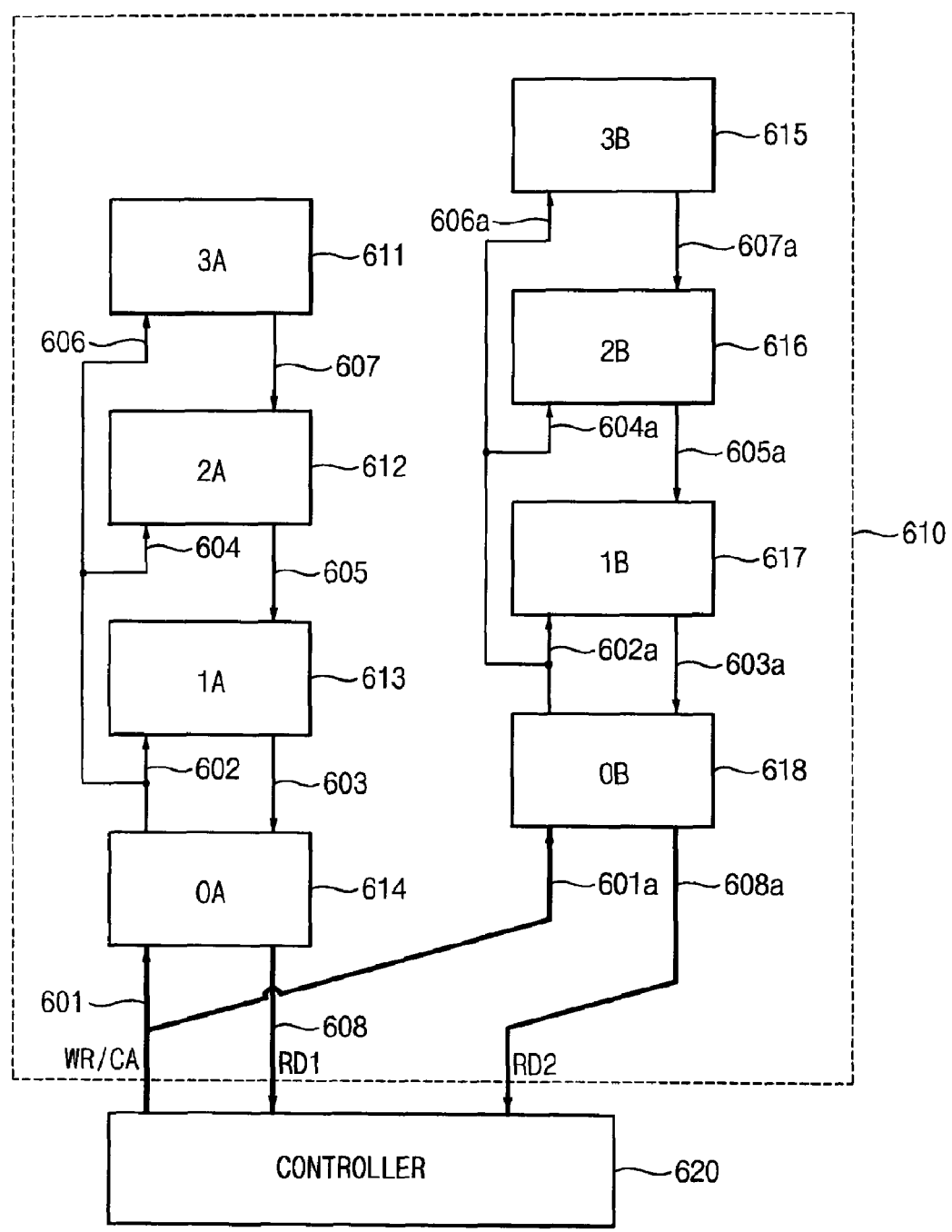

FIG. 10 is a block diagram illustrating a memory system 600 according to a seventh example embodiment of the present invention.

Referring to FIG. 10, the memory system 600 includes a memory module 610 and a memory controller 620.

The memory module 610 includes a first semiconductor memory device (0A) 614, a second semiconductor memory device (1A) 613, a third semiconductor memory device (2A) 612, a fourth semiconductor memory device (3A) 611, a fifth semiconductor memory device (0B) 618, a sixth semiconductor memory device (1B) 617, a seventh semiconductor memory device (2B) 616 and an eighth semiconductor memory device (3B) 615. The memory controller 620 sets a signaling mode based on stack position information of each of the semiconductor memory devices 611, 612, 613, 614, 615, 616, 617 and 618.

In FIG. 10, a bus drawn with a thick line represents a bus in which signaling is performed in a differential signaling mode, and a bus drawn with a thin line represents a bus in which signaling is performed in a single-ended signaling mode.

The first semiconductor memory device (0A) 614 receives a first packet WR/CA in the differential signaling mode through a first port (not shown) from the memory controller 620, outputs the first packet WR/CA through a second port (not shown), receives first read data through a third port (not shown) in the single-ended signaling mode, outputs second read data RD1 through a fourth port (not shown), and transmits the second read data RD1 to the memory controller 620 in the differential signaling mode. The first port is electrically coupled to the memory controller 620 through a first bus 601, and the fourth port is electrically coupled to the memory controller 620 through an eighth bus 608.

The second semiconductor memory device (1A) 613 is coupled to the first semiconductor memory device (0A) 614. The second semiconductor memory device (1A) 613 receives the first packet WR/CA in the single-ended signaling mode through a fifth port (not shown) from the first semiconductor memory device (0A) 614, receives third read data in the single-ended signaling mode through a sixth port (not shown), and outputs the first read data through a seventh port (not shown). The fifth port and the second port are electrically coupled to each other through a second bus 602. The seventh port and the third port are electrically coupled to each other through a third bus 603.

The third semiconductor memory device (2A) 612 is coupled to the first semiconductor memory device (0A) 614 and the second semiconductor memory device (1A) 613. The third semiconductor memory device (2A) 612 receives the first packet WR/CA in the single-ended signaling mode through an eighth port (not shown) from the first semiconductor memory device (0A) 614, receives fourth read data in the single-ended signaling mode through a ninth port (not shown), and outputs the third read data through a tenth port (not shown). The eighth port and the second port are electrically coupled to each other through a fourth bus 604. The tenth port and the sixth port are electrically coupled to each other through a fifth bus 605.

The fourth semiconductor memory device (3A) 611 is coupled to the first semiconductor memory device (0A) 614 and the third semiconductor memory device (2A) 612. The fourth semiconductor memory device (3A) 611 receives the first packet WR/CA in the single-ended signaling mode through an eleventh port (not shown) from the first semiconductor memory device (0A) 614, and outputs the fourth read data through a twelfth port (not shown). The eleventh port and the second port are electrically coupled to each other through a sixth bus 606. The twelfth port and the ninth port are electrically coupled to each other through a seventh bus 607.

The fifth semiconductor memory device (0B) 618 receives a first packet WR/CA in the differential signaling mode through a thirteenth port (not shown) from the memory controller 620, outputs the first packet WR/CA through a fourteenth port (not shown), receives fifth read data through a fifteenth port (not shown) in the single-ended signaling mode, outputs sixth read data RD2 through a sixteenth port (not shown), and transmits the sixth read data RD2 to the memory controller 620 in the differential signaling mode. The thirteenth port is electrically coupled to the memory controller 620 through a ninth bus 601a. The sixteenth port is electrically coupled to the memory controller 620 through a sixteenth bus 608a.

The sixth semiconductor memory device (1B) 617 is coupled to the fifth semiconductor memory device (0B) 618. The sixth semiconductor memory device (1B) 617 receives the first packet WR/CA in the single-ended signaling mode through a seventeenth port (not shown) from the fifth semiconductor memory device (0B) 618, receives seventh read data in the single-ended signaling mode through an eighteenth port (not shown), and outputs the fifth read data through a nineteenth port (not shown). The fourteenth port and the seventeenth port are electrically coupled to each other through a tenth bus 602a. The nineteenth port and the fifteenth port are electrically coupled to each other through an eleventh bus 603a.

The seventh semiconductor memory device (2B) 616 is coupled to the fifth semiconductor memory device (0B) 618 and the sixth semiconductor memory device (1B) 617. The seventh semiconductor memory device (2B) 616 receives the first packet WR/CA in the single-ended signaling mode through a twentieth port (not shown) from the fifth semiconductor memory device (0B) 618, receives eighth read data in the single-ended signaling mode through a twenty-first port (not shown), and outputs the seventh read data through a twenty-second port (not shown). The twentieth port and the fourteenth port are electrically coupled to each other through a twelfth bus 604a. The twenty-second port and the eighteenth port are electrically coupled to each other through a thirteenth bus 605a.

The eighth semiconductor memory device (3B) 615 is coupled to the fifth semiconductor memory device (0B) 618 and the seventh semiconductor memory device (2B) 616. The eighth semiconductor memory device (3B) 615 receives the first packet WR/CA in the single-ended signaling mode through a twenty-third port (not shown) from the fifth semiconductor memory device (0B) 618, and outputs the eighth read data through a twenty-fourth port (not shown). The twenty-third port and the fourteenth port are electrically coupled to each other through a fourteenth bus 606a. The twenty-fourth port and the twenty-first port are electrically coupled to each other through a fifteenth bus 607a.

In FIG. 10, the first packet WR/CA is mixed data of write data, commands and addresses.

Figure 11:
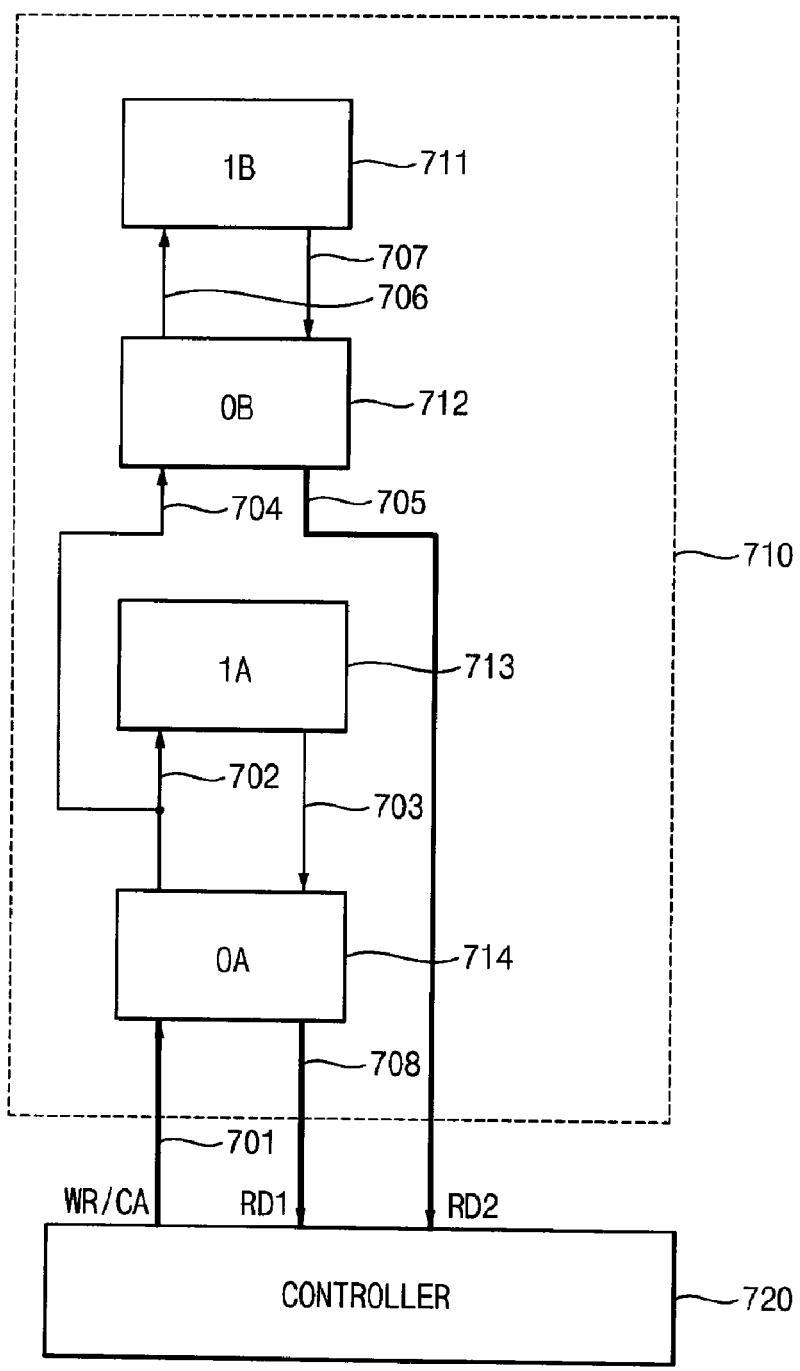

FIG. 11 is a block diagram illustrating a memory system 700 according to an eighth example embodiment of the present invention.

Referring to FIG. 11, the memory system 700 includes a memory module 710 and a memory controller 720.

The memory module 710 includes a first semiconductor memory device (0A) 714, a second semiconductor memory device (1A) 713, a third semiconductor memory device (0B) 712 and a fourth semiconductor memory device (1B) 711. The memory controller 720 sets a signaling mode based on stack position information of each of the semiconductor memory devices 711, 712, 713 and 714. In FIG. 11, a bus drawn with a thick line represents a bus in which signaling is performed in a differential signaling mode, and a bus drawn with a thin line represents a bus in which signaling is performed in a single-ended signaling mode.

The first semiconductor memory device (0A) 714 receives a first packet WR/CA in the differential signaling mode through a first port (not shown) from the memory controller 720, outputs the first packet WR/CA through a second port (not shown), receives first read data through a third port (not shown) in the single-ended signaling mode, outputs second read data RD1 through a fourth port (not shown), and transmits the second read data RD1 to the memory controller 720 in the differential signaling mode. The first port is electrically coupled to the memory controller 720 through a first bus 701, and the fourth port is electrically coupled to the memory controller 720 through a second bus 708.

The second semiconductor memory device (1A) 713 is coupled to the first semiconductor memory device (0A) 714. The second semiconductor memory device (1A) 713 receives the first packet WR/CA in the single-ended signaling mode through a fifth port (not shown) from the first semiconductor memory device (0A) 714, and outputs the first read data through a sixth port (not shown). The second port and the fifth port are electrically coupled to each other through a third bus 702, and the third port and the sixth port are electrically coupled to each other through a fourth bus 703.

The third semiconductor memory device (0B) 712 is coupled to the first semiconductor memory device (0A) 714, receives the first packet WR/CA in the single-ended signaling mode through a seventh port (not shown) from the first semiconductor memory device (0A) 714, outputs the first packet WR/CA through an eighth port (not shown), receives third read data in the single-ended signaling mode through a ninth port (not shown), outputs fourth read data RD2 through a tenth port (not shown), and transmits the fourth read data RD2 to the memory controller 720 in the differential signaling mode. The seventh port and the second port are electrically coupled to each other through a fifth bus 704, and the tenth port is electrically coupled to the memory controller 720 through a sixth bus 705.

The fourth semiconductor memory device (1B) 711 is coupled to the third semiconductor memory device (0B) 712. The fourth semiconductor memory device (1B) 711 receives the first packet WR/CA in the single-ended signaling mode through an eleventh port (not shown) from the third semiconductor memory device (0B) 712, and outputs the third read data through a twelfth port (not shown). The eighth port and the eleventh port are electrically coupled to each other through a seventh bus 706, and the ninth port and the twelfth port are electrically coupled to each other through an eighth bus 707.

In FIG. 11, the first packet WR/CA is mixed data of write data, commands and addresses.

Figure 12:
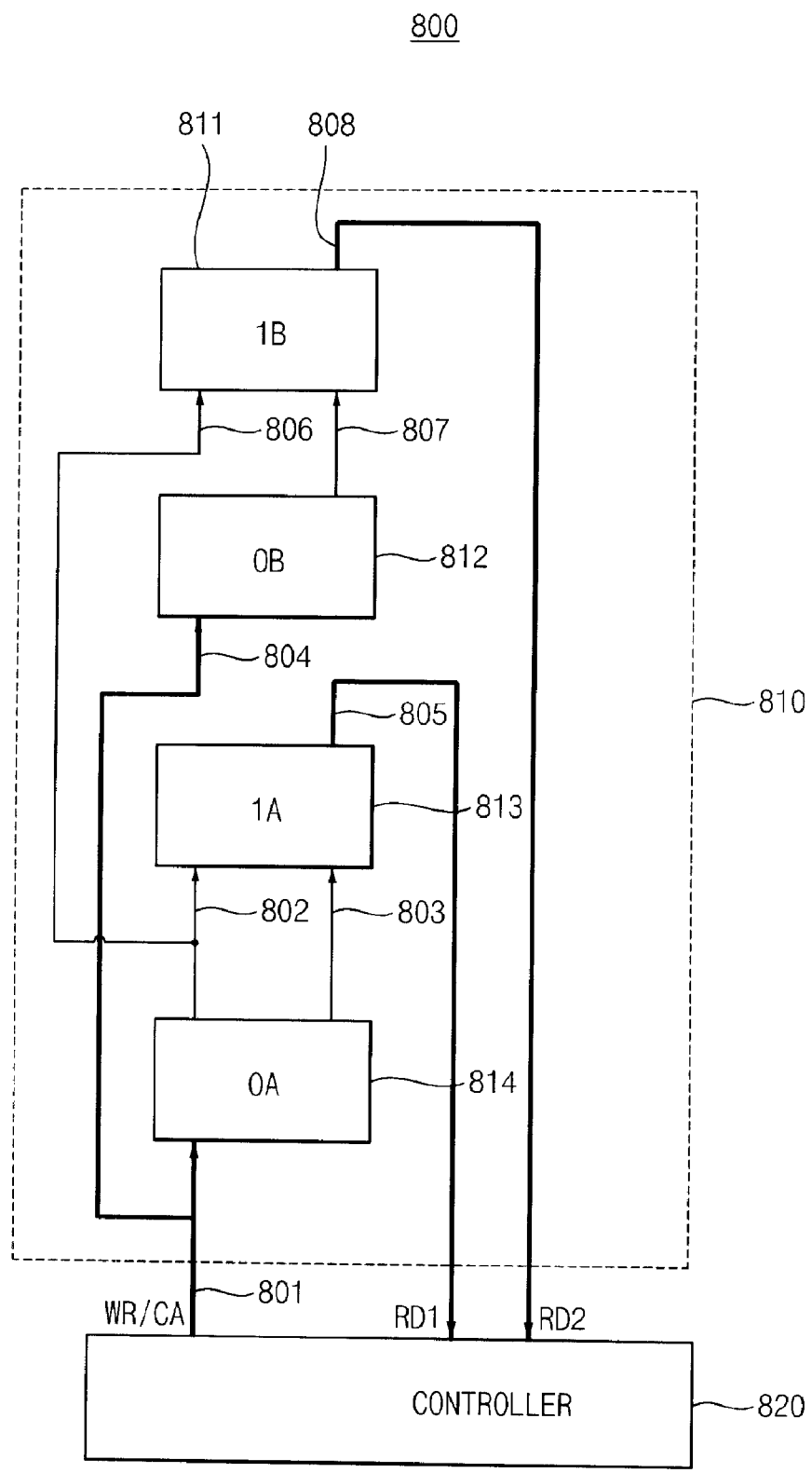

FIG. 12 is a block diagram illustrating a memory system according to a ninth example embodiment of the present invention.

Referring to FIG. 12, the memory system 800 includes a memory module 810 and a memory controller 820.

The memory module 810 includes a first semiconductor memory device (0A) 814, a second semiconductor memory device (1A) 813, a third semiconductor memory device (0B) 812 and a fourth semiconductor memory device (1B) 811. The memory controller 820 sets a signaling mode based on stack position information of each of the semiconductor memory devices 811, 812, 813 and 814. In FIG. 12, a bus drawn with a thick line represents a bus in which signaling is performed in a differential signaling mode, and a bus drawn with a thin line represents a bus in which signaling is performed in a single-ended signaling mode.

The first semiconductor memory device (0A) 814 receives a first packet WR/CA in the differential signaling mode through a first port (not shown) from the memory controller 820, outputs the first packet WR/CA through a second port (not shown), and outputs first read data through a third port (not shown). The first port is electrically coupled to the memory controller 820 through a first bus 801.

The second semiconductor memory device (1A) 813 is coupled to the first semiconductor memory device (0A) 814. The second semiconductor memory device (1A) 813 receives the first packet WR/CA in the single-ended signaling mode through a fourth port (not shown), receives the first read data in the single-ended signaling mode through a fifth port (not shown), outputs second read data RD1 through a sixth port (not shown), and transmits the second read data RD1 to the memory controller 820 in the differential signaling mode. The second port and the fourth port are electrically coupled to each other through a second bus 802, and the third port and the fifth port are electrically coupled to each other through a third bus 803. The sixth port is electrically coupled to the memory controller 820 through a fourth bus 805.

The third semiconductor memory device (0B) 812 is coupled to the memory controller 820. The third semiconductor memory device (0B) 812 receives the first packet WR/CA in the differential signaling mode through a seventh port (not shown) from the memory controller 820, and outputs third read data through an eighth port (not shown). The seventh port is electrically coupled to the memory controller 820 through a fifth bus 804.

The fourth semiconductor memory device (1B) 811 is coupled to the first semiconductor memory device (0A) 814 and the third semiconductor memory device (0B) 812. The fourth semiconductor memory device (1B) 811 receives the first packet WR/CA in the single-ended signaling mode through a ninth port (not shown) from the first semiconductor memory device (0A) 814, receives the third read data in the single-ended signaling mode through a tenth port (not shown), outputs fourth read data RD2 through an eleventh port (not shown), and transmits the fourth read data RD2 to the memory controller 820 in the differential signaling mode. The ninth port and the second port are electrically coupled to each other through a sixth bus 806, and the tenth port and the eighth port are electrically coupled to each other through a seventh bus 807. The eleventh port is electrically coupled to the memory controller 820 through an eighth bus 808.

In FIG. 12, the first packet WR/CA is mixed data of write data, commands and addresses.

Figure 13:
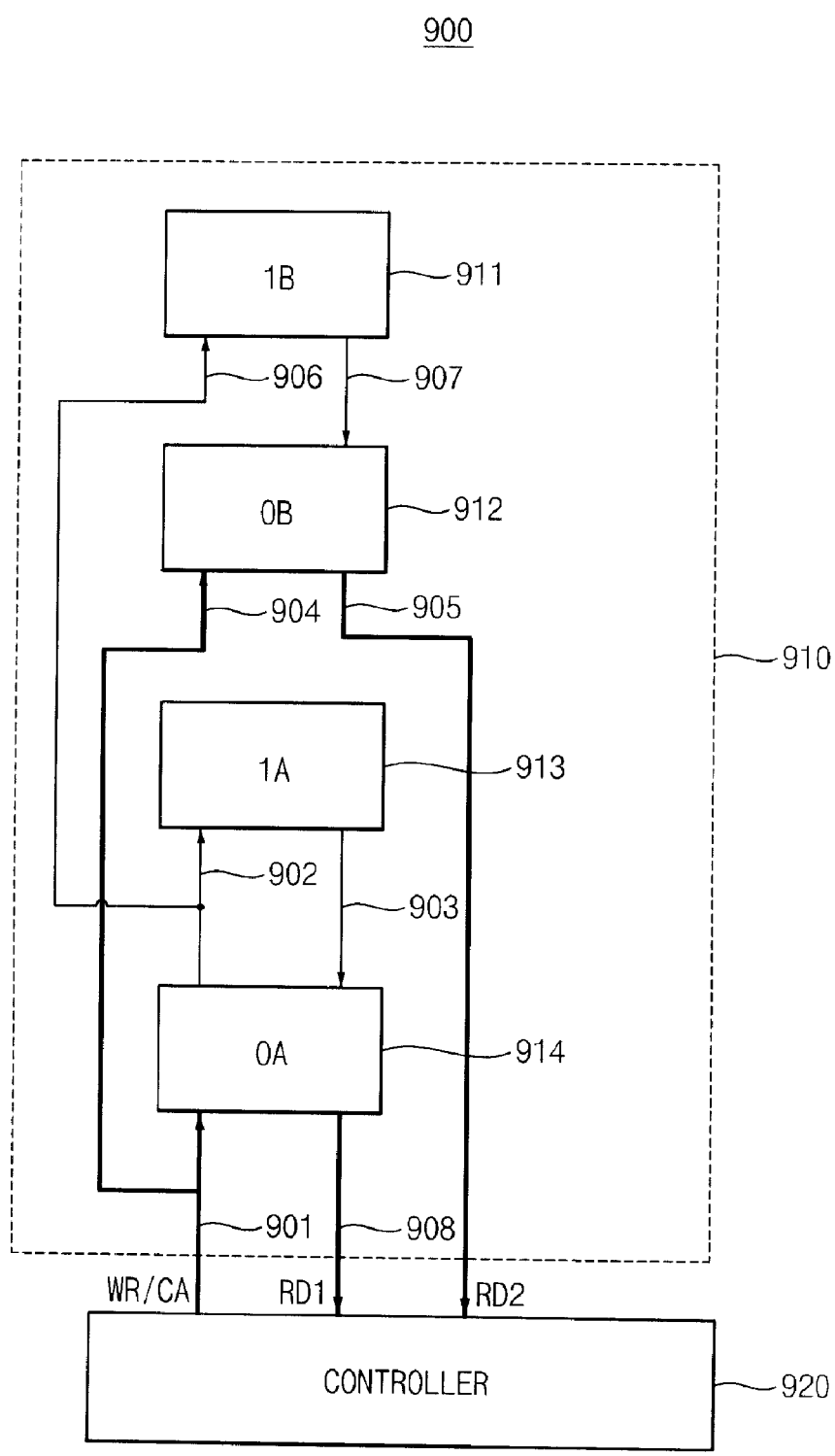

FIG. 13 is a block diagram illustrating a memory system 900 according to a tenth example embodiment of the present invention.

Referring to FIG. 13, the memory system 900 includes a memory module 910 and a memory controller 920.

The memory module 910 includes a first semiconductor memory device (0A) 914, a second semiconductor memory device (1A) 913, a third semiconductor memory device (0B) 912 and a fourth semiconductor memory device (1B) 911. The memory controller 920 sets a signaling mode based on stack position information of each of the semiconductor memory devices 911, 912, 913 and 914. In FIG. 13, a bus drawn with a thick line represents a bus in which signaling is performed in a differential signaling mode, and a bus drawn with a thin line represents a bus in which signaling is performed in a single-ended signaling mode.

The first semiconductor memory device (0A) 914 receives a first packet WR/CA in the differential signaling mode through a first port (not shown) from the memory controller 920, outputs the first packet WR/CA through a second port (not shown), receives first read data through a third port (not shown) in the single-ended signaling mode, outputs second read data RD1 through a fourth port (not shown), and transmits the second read data RD1 to the memory controller 920 in the differential signaling mode. The first port is electrically coupled to the memory controller 920 through a first bus 901, and the fourth port is electrically coupled to the memory controller 920 through a second bus 908.

The second semiconductor memory device (1A) 913 is coupled to the first semiconductor memory device (0A) 914. The second semiconductor memory device (1A) 913 receives the first packet WR/CA in the single-ended signaling mode through a fifth port (not shown) from the first semiconductor memory device (0A) 914, outputs the first read data through a sixth port (not shown). The second port and the fifth port are electrically coupled to each other through a third bus 902, and the third port and the sixth port are electrically coupled to each other through a fourth bus 903.

The third semiconductor memory device (0B) 912 is coupled to the memory controller 920. The third semiconductor memory device (0B) 912 receives the first packet WR/CA in the differential signaling mode through a seventh port (not shown) from the memory controller, receives third read data in the single-ended signaling mode through an eighth port (not shown), outputs fourth read data RD2 through a ninth port (not shown), and transmits the fourth read data RD2 to the memory controller 920 in the differential signaling mode. The seventh port is electrically coupled to the memory controller 920 through a fifth bus 904, and the ninth port is electrically coupled to the memory controller 920 through a seventh bus 905.

The fourth semiconductor memory device (1B) 911 is coupled to the first semiconductor memory device (0A) 914 and the third semiconductor memory device (0B) 912. The fourth semiconductor memory device (1B) 911 receives the first packet WR/CA in the single-ended signaling mode through a tenth port (not shown) from the first semiconductor memory device (0A) 914, and outputs the third read data through an eleventh port (not shown). The tenth port and the second port are electrically coupled to each other through a sixth bus 906, and the eleventh port and the eighth port are electrically coupled to each other through an eighth bus 907.

In FIG. 13, the first packet WR/CA is mixed data of write data, commands and addresses.

In the memory system having stack structures as illustrated in FIGS. 2 to FIG. 13, each of the semiconductor memory devices has a differential signaling mode and a single-ended signaling mode in input ports and output ports. Therefore, the semiconductor memory devices may set the differential signaling mode and the single-ended signaling mode selectively using stack position information.

As described above, the memory system may selectively set signaling modes based on stack position information. Further, the memory system according to the present invention may have low power consumption.

While the example embodiments of the present invention and its advantages have been described in detail, it should be understood that various changes, substitutions and alterations can be made herein without departing from the scope of the invention as defined by appended claims.

What is claimed is:

1. A memory system comprising:
   a memory module having a first semiconductor memory device and a second semiconductor memory device, the first and second semiconductor memory devices in a stacked configuration; and
   a memory controller configured to set a signaling mode between the memory controller and each of the semiconductor memory devices, and among the semiconductor memory devices based on stack position information of each of the semiconductor memory devices,
   wherein the first semiconductor memory device is set in a differential signaling mode and the second semiconductor memory device is set in a single-ended signaling mode.

2. The memory system of claim 1, wherein signaling between the memory controller and each of the semiconductor memory devices is performed in a differential signaling mode, and signaling among the semiconductor memory devices is performed in a single-ended signaling mode.

3. The memory system of claim 2, wherein the memory controller determines the signaling mode using identifiers that correspond to each of the semiconductor memory devices.

4. The memory system of claim 2, wherein the first semiconductor memory device is configured to receive a first packet in the differential signaling mode through a first port from the memory controller, configured to output the first packet through a second port, and configured to output first read data through a third port;
   wherein the second semiconductor memory device is coupled to the first semiconductor memory device, the second semiconductor memory device configured to receive the first packet in the single-ended signaling mode through a fourth port, configured to receive the first read data in the single-ended signaling mode through a fifth port, configured to output second read data through a sixth port, and configured to transmit the second read data to the memory controller in the differential signaling mode; and
   wherein the memory module further includes:
      a third semiconductor memory device coupled to the first semiconductor memory device, the third semiconductor memory device configured to receive the first packet in the single-ended signaling mode through a seventh port, configured to output the first packet through an eighth port, and configured to output third read data through a ninth port; and
      a fourth semiconductor memory device coupled to the third semiconductor memory device, the fourth semiconductor memory device configured to receive the first packet in the single-ended signaling mode through a tenth port, configured to receive the third read data in the single-ended signaling mode through an eleventh port, configured to output the fourth read data through a twelfth port, and configured to transmit the fourth read data to the memory controller in the differential signaling mode.

5. The memory system of claim 4, wherein the first packet is merged data that includes read data, a command and an address.

6. The memory system of claim 4, wherein the first semiconductor memory device and the third semiconductor memory device have the same rank, and the second semiconductor memory device and the fourth semiconductor memory device have the same rank.

7. The memory system of claim 2, wherein the first semiconductor memory device is configured to receive a first packet in the differential signaling mode through a first port from the memory controller, configured to output the first packet through a second port, configured to output first read data through a third port, and configured to transmit the first read data to the memory controller in the differential signaling mode; and
   wherein the second semiconductor memory device is coupled to the first semiconductor memory device, the second semiconductor memory device configured to receive the first packet in the single-ended signaling mode through a fourth port, configured to output the second read data through a fifth port, and configured to transmit the second read data to the memory controller in the differential signaling mode.

8. The memory system of claim 7, wherein the first packet is merged data that includes read data, a command and an address, and
   wherein the first semiconductor memory device and the second semiconductor memory device have the same rank.

9. The memory system of claim 2, wherein the first semiconductor memory device is configured to receive a first packet in the differential signaling mode through a first port from the memory controller, configured to output first read data through a second port, and configured to transmit the first read data to the memory controller in the differential signaling mode; and
   wherein the second semiconductor memory device is coupled to the memory controller, the second semiconductor memory device configured to receive the first packet in the differential signaling mode through a third port, configured to output second read data through a fourth port, and configured to transmit the second read data to the memory controller in the differential signaling mode.

10. The memory system of claim 9, wherein the first packet is merged data that includes read data, a command and an address, and
    wherein the first semiconductor memory device and the second semiconductor memory device have the same rank.

11. The memory system of claim 2, wherein the first semiconductor memory device is configured to receive a first packet in the differential signaling mode through a first port from the memory controller, configured to output the first packet through a second port, and configured to output first read data through a third port;
    wherein the second semiconductor memory device is coupled to the first semiconductor memory device, the second semiconductor memory device configured to receive the first packet in the single-ended signaling mode through a fourth port, configured to receive the first read data in the single-ended signaling mode through a fifth port, configured to output second read data through a sixth port, and configured to transmit the second read data to the memory controller in the differential signaling mode; and wherein the memory module further includes:
- a third semiconductor memory device coupled to the memory controller, the third semiconductor memory device configured to receive the first packet in the differential signaling mode through a seventh port from the memory controller, configured to output the first packet through an eighth port, and configured to output third read data through a ninth port; and
- a fourth semiconductor memory device coupled to the third semiconductor memory device, the fourth semiconductor memory device configured to receive the first packet in the single-ended signaling mode through a tenth port, configured to receive the third read data in the single-ended signaling mode through an eleventh port, configured to output the fourth read data through a twelfth port, and configured to transmit the fourth read data to the memory controller in the differential signaling mode.

12. The memory system of claim 11, wherein the first packet is merged data that includes read data, a command and an address, and
   wherein the first semiconductor memory device and the third semiconductor memory device have the same rank, and the second semiconductor memory device and the fourth semiconductor memory device have the same rank.

13. The memory system of claim 2, wherein the first semiconductor memory device is configured to receive a first packet in the differential signaling mode through a first port from the memory controller, configured to output the first packet through a second port, and configured to output first read data through a third port;
   wherein the second semiconductor memory device is coupled to the first semiconductor memory device, the second semiconductor memory device configured to receive the first packet in the single-ended signaling mode through a fourth port, configured to receive the first read data in the single-ended signaling mode through a fifth port, and configured to output second read data through a sixth port; and
   wherein the memory module further includes:
   - a third semiconductor memory device coupled to the first semiconductor memory device and the second semiconductor memory device, the third semiconductor memory device configured to receive the first packet in the single-ended signaling mode through a seventh port, configured to receives the second read data in the single-ended signaling mode through an eighth port, and configured to output third read data through a ninth port;
   - a fourth semiconductor memory device coupled to the third semiconductor memory device, the fourth semiconductor memory device configured to receive the first packet in the single-ended signaling mode through a tenth port, configured to receive the third read data in the single-ended signaling mode through an eleventh port, configured to output fourth read data through a twelfth port, and configured to transmit the fourth read data to the memory controller in the differential signaling mode;
   - a fifth semiconductor memory device configured to receive a first packet in the differential signaling mode through a thirteenth port from the memory controller, configured to output the first packet through a fourteenth port, and configured to output fifth read data through a fifteenth port;
   - a sixth semiconductor memory device coupled to the fifth semiconductor memory device, the sixth semiconductor memory device configured to receive the first packet in the single-ended signaling mode through a sixteenth port, configured to receive the fifth read data in the single-ended signaling mode through a seventeenth port, configured to output sixth read data through a eighteenth port, and configured to transmit the sixth read data to the memory controller in the differential signaling mode;
   - a seventh semiconductor memory device coupled to the fifth semiconductor memory device and the sixth semiconductor memory device, the seventh semiconductor memory device configured to receive the first packet in the single-ended signaling mode through a nineteenth port, configured to receive the sixth read data in the single-ended signaling mode through an twentieth port, and configured to output seventh read data through a twenty-first port; and
   - an eighth semiconductor memory device coupled to the fifth semiconductor memory device and the seventh semiconductor memory device, the eighth semiconductor memory device configured to receive the first packet in the single-ended signaling mode through a twenty-second port from the fifth semiconductor memory device, configured to receive the seventh read data in the single-ended signaling mode through an twenty-third port, configured to output eighth read data through a twenty-fourth port, and configured to transmit the eighth read data to the memory controller in the differential signaling mode.

14. The memory system of claim 13, wherein the first packet is merged data that includes read data, a command and an address, and
   wherein the first semiconductor memory device and the fifth semiconductor memory device have the same rank, the second semiconductor memory device and the sixth semiconductor memory device have the same rank, the third semiconductor memory device and the seventh semiconductor memory device have the same rank, and the fourth semiconductor memory device and the eighth semiconductor memory device have the same rank.

15. The memory system of claim 2, wherein the first semiconductor memory device is configured to receive a first packet in the differential signaling mode through a first port from the memory controller, configured to output first read data through a second port, configured to output second read data through a third port, and configured to transmit the first read data and the second read data to the memory controller in the differential signaling mode.

16. The memory system of claim 15, wherein the first packet is merged data that includes read data, a command and an address.

17. The memory system of claim 2, wherein the first semiconductor memory device is configured to receive a first packet in the differential signaling mode through a first port from the memory controller, configured to output the first packet through a second port, configured to receive first read data through a third port in the single-ended signaling mode, configured to output second read data through a fourth port, and configured to transmit the second read data to the memory controller in the differential signaling mode;
   wherein the second semiconductor memory device is coupled to the first semiconductor memory device, the second semiconductor memory device configured to receive the first packet in the single-ended signaling mode through a fifth port from the first semiconductor memory device, configured to receive the third read data in the single-ended signaling mode through a sixth port, and configured to output the first read data through a seventh port; and wherein the memory module further includes:
  a third semiconductor memory device coupled to the first semiconductor memory device and the second semiconductor memory device, the third semiconductor memory device configured to receive the first packet in the single-ended signaling mode through an eighth port from the first semiconductor memory device, configured to receive fourth read data in the single-ended signaling mode through a ninth port, and configured to output the third read data through a tenth port;
  a fourth semiconductor memory device coupled to the first semiconductor memory device and the third semiconductor memory device, the fourth semiconductor memory device configured to receive the first packet in the single-ended signaling mode through an eleventh port from the first semiconductor memory device, and configured to output the fourth read data through a twelfth port;
  a fifth semiconductor memory device configured to receive a first packet in the differential signaling mode through a thirteenth port from the memory controller, the fifth semiconductor memory device configured to output the first packet through a fourteenth port, configured to receive fifth read data through a fifteenth port in the single-ended signaling mode, configured to output sixth read data through a sixteenth port, and configured to transmit the sixth read data to the memory controller in the differential signaling mode;
  a sixth semiconductor memory device coupled to the fifth semiconductor memory device, the sixth semiconductor memory device configured to receive the first packet in the single-ended signaling mode through a seventeenth port from the fifth semiconductor memory device, configured to receive the seventh read data in the single-ended signaling mode through an eighteenth port, and configured to output the fifth read data through a nineteenth port;
  a seventh semiconductor memory device coupled to the fifth semiconductor memory device and the sixth semiconductor memory device, the seventh semiconductor memory device configured to receive the first packet in the single-ended signaling mode through an twentieth port from the fifth semiconductor memory device, configured to receive eighth read data in the single-ended signaling mode through a twenty-first port, and configured to output the seventh read data through a twenty-second port; and
  an eighth semiconductor memory device coupled to the fifth semiconductor memory device and the seventh semiconductor memory the device, eighth semiconductor memory device configured to receive the first packet in the single-ended signaling mode through a twenty-third port from the fifth semiconductor memory device, and configured to output the eighth read data through a twenty-fourth port.

18. The memory system of claim 17, wherein the first packet is merged data that includes read data, a command and an address, and wherein the first semiconductor memory device and the fifth semiconductor memory device have the same rank, the second semiconductor memory device and the sixth semiconductor memory device have the same rank, the third semiconductor memory device and the seventh semiconductor memory device have the same rank, and the fourth semiconductor memory device and the eighth semiconductor memory device have the same rank.

19. The memory system of claim 2, wherein the first semiconductor memory device is configured to receive a first packet in the differential signaling mode through a first port from the memory controller, configured to output the first packet through a second port, configured to receive first read data through a third port in the single-ended signaling mode, configured to output second read data through a fourth port, and configured to transmit the second read data to the memory controller in the differential signaling mode;

wherein the second semiconductor memory device is coupled to the first semiconductor memory device, the second semiconductor memory device configured to receive the first packet in the single-ended signaling mode through a fifth port from the first semiconductor memory device, and configured to output the first read data through a sixth port; and wherein the memory module further includes:
  a third semiconductor memory device coupled to the first semiconductor memory device, the third semiconductor memory device configured to receive the first packet in the single-ended signaling mode through a seventh port from the first semiconductor memory device, configured to output the first packet through an eighth port, configured to receive third read data in the single-ended signaling mode through a ninth port, configured to output fourth read data through a tenth port, and configured to transmit the fourth read data to the memory controller in the differential signaling mode; and
  a fourth semiconductor memory device coupled to the third semiconductor memory device, the fourth semiconductor memory device configured to receive the first packet in the single-ended signaling mode through an eleventh port from the third semiconductor memory device, and configured to output the third read data through a twelfth port.

20. The memory system of claim 19, wherein the first packet is merged data that includes read data, a command and an address, and wherein the first semiconductor memory device and the third semiconductor memory device have the same rank, and the second semiconductor memory device and the fourth semiconductor memory device have the same rank.

21. The memory system of claim 2, wherein the first semiconductor memory device is configured to receive a first packet in the differential signaling mode through a first port from the memory controller, configured to output the first packet through a second port, and configured to output first read data through a third port;

wherein the second semiconductor memory device is coupled to the first semiconductor memory device, the second semiconductor memory device configured to receive the first packet in the single-ended signaling mode through a fourth port, configured to receive the first read data in the single-ended signaling mode through a fifth port, configured to output second read data through a sixth port, and configured to transmit the second read data to the memory controller in the differential signaling mode; and wherein the memory module further includes:
a third semiconductor memory device coupled to the memory controller, the third semiconductor memory device configured to receive the first packet in the differential signaling mode through a seventh port from the memory controller, and configured to output third read data through an eighth port; and a fourth semiconductor memory device coupled to the first semiconductor memory device and the third semiconductor memory device, the fourth semiconductor memory device configured to receive the first packet in the single-ended signaling mode through a ninth port from the first semiconductor memory device, configured to receive the third read data in the single-ended signaling mode through a tenth port, configured to output fourth read data through an eleventh port, and configured to transmit the fourth read data to the memory controller in the differential signaling mode.

22. The memory system of claim 21, wherein the first packet is merged data that includes read data, a command and an address, and wherein the first semiconductor memory device and the third semiconductor memory device have the same rank, and the second semiconductor memory device and the fourth semiconductor memory device have the same rank.

23. The memory system of claim 2, wherein the first semiconductor memory device is configured to receive a first packet in the differential signaling mode through a first port from the memory controller, configured to output the first packet through a second port, configured to receive first read data through a third port in the single-ended signaling mode, configured to output second read data through a fourth port, and configured to transmit the second read data to the memory controller in the differential signaling mode;

wherein the second semiconductor memory device is coupled to the first semiconductor memory device, the second semiconductor memory device configured to receive the first packet in the single-ended signaling mode through a fifth port from the first semiconductor memory device, and configured to output the first read data through a sixth port; and wherein the memory module further includes:
a third semiconductor memory device coupled to the memory controller, the third semiconductor memory device configured to receive the first packet in the differential signaling mode through a seventh port from the memory controller, configured to receive third read data in the single-ended signaling mode through an eighth port, configured to output fourth read data through a ninth port, and configured to transmit the fourth read data to the memory controller in the differential signaling mode; and a fourth semiconductor memory device coupled to the first semiconductor memory device, the fourth semiconductor memory device configured to receive the first packet in the single-ended signaling mode through a tenth port from the first semiconductor memory device, and configured to output the third read data through an eleventh port.

24. The memory system of claim 23, wherein the first packet is merged data that includes read data, a command and an address, and wherein the first semiconductor memory device and the third semiconductor memory device have the same rank, and the second semiconductor memory device and the fourth semiconductor memory device have the same rank.

* * * * *